United States Patent
Kim et al.

(10) Patent No.: US 12,009,389 B2
(45) Date of Patent: Jun. 11, 2024

(54) EDGE TERMINATION FOR POWER SEMICONDUCTOR DEVICES AND RELATED FABRICATION METHODS

(71) Applicant: Wolfspeed, Inc., Durham, NC (US)

(72) Inventors: Woongsun Kim, Cary, NC (US); Daniel Jenner Lichtenwalner, Raleigh, NC (US); Sei-Hyung Ryu, Cary, NC (US); Naeem Islam, Morrisville, NC (US)

(73) Assignee: WOLFSPEED, INC., Durham, NC (US)

( * ) Notice: Subject to any disclaimer, the term of this patent is extended or adjusted under 35 U.S.C. 154(b) by 107 days.

(21) Appl. No.: 17/538,026

(22) Filed: Nov. 30, 2021

(65) Prior Publication Data

US 2023/0170383 A1    Jun. 1, 2023

(51) Int. Cl.
*H01L 29/06* (2006.01)
*H01L 29/66* (2006.01)
*H01L 29/78* (2006.01)

(52) U.S. Cl.
CPC .... *H01L 29/0619* (2013.01); *H01L 29/66712* (2013.01); *H01L 29/7811* (2013.01); *H01L 29/7813* (2013.01)

(58) Field of Classification Search
CPC .......... H01L 29/0619; H01L 29/66712; H01L 29/7811; H01L 29/7813; H01L 21/0465; H01L 29/0615; H01L 29/66068; H01L 29/0623; H01L 29/0696; H01L 29/1608; H01L 29/66734; H01L 29/7397
See application file for complete search history.

(56) References Cited

U.S. PATENT DOCUMENTS

| 11,081,554 | B2* | 8/2021 | Hossain | H01L 29/66734 |
| 2004/0135153 | A1 | 7/2004 | Ryu et al. | |
| 2014/0264562 | A1* | 9/2014 | Cheng | H01L 29/7813 438/270 |

(Continued)

FOREIGN PATENT DOCUMENTS

| CN | 106409884 A | 2/2017 |
| CN | 104241338 B | 6/2017 |

(Continued)

OTHER PUBLICATIONS

Antoniou et al. "Deep p-Ring Trench Termination: An Innovative and Cost-Effective Way to Reduce Silicon Area" IEEE Electron Device Letters 40(2):177-180 (Feb. 2019).

(Continued)

*Primary Examiner* — Shahed Ahmed
*Assistant Examiner* — Khatib A Rahman
(74) *Attorney, Agent, or Firm* — Myers Bigel, P.A.

(57) ABSTRACT

A power semiconductor device includes semiconductor layer structure comprising a semiconductor drift region of a first conductivity type and an edge termination region comprising a plurality of guard rings of a second conductivity type. The guard rings extend into a surface of the semiconductor drift region. The guard rings respectively comprise a first portion adjacent the surface and a second portion spaced from the surface, where the first portion is wider than the second portion. Related devices and fabrication methods are also discussed.

32 Claims, 13 Drawing Sheets

(56) References Cited

U.S. PATENT DOCUMENTS

| | | | | |
|---|---|---|---|---|
| 2016/0020308 A1* | 1/2016 | Turner | ............... | H01L 29/1095 |
| | | | | 438/138 |
| 2016/0027866 A1* | 1/2016 | Yoshikawa | ........... | H01L 29/063 |
| | | | | 257/484 |
| 2019/0109230 A1* | 4/2019 | Uhnevionak | ..... | H01L 29/66712 |
| 2021/0125889 A1* | 4/2021 | Chen | ................ | H01L 29/66348 |
| 2021/0343834 A1* | 11/2021 | Lichtenwalner | .... | H01L 29/1608 |
| 2022/0130996 A1 | 4/2022 | Islam et al. | | |

FOREIGN PATENT DOCUMENTS

| | | |
|---|---|---|
| CN | 112993017 A | 6/2021 |
| EP | 3012870 A1 | 4/2016 |

OTHER PUBLICATIONS

Deng et al. "Multizone Gradient-Modulated Guard Ring Technique for Ultrahigh Voltage 4H—SiC Devices With Increased Tolerances to Implantation Dose and Surface Charges" IEEE Journal of Emerging and Selected Topics in Power Electronics 7(3):1505-1512 (Sep. 2019).

Notification of Transmittal of the International Search Report and the Written Opinion of the International Searching Authority, or the Declaration, in corresponding PCT Application No. PCT/US2022/080114 (dated Mar. 20, 2023).

* cited by examiner

EDGE TERMINATION FOR POWER SEMICONDUCTOR DEVICES AND RELATED FABRICATION METHODS

FIELD

The present disclosure relates to power semiconductor devices and methods of fabricating such devices.

BACKGROUND

Power semiconductor devices are used to carry large currents and support high voltages. A wide variety of power semiconductor devices may be used in the art, including, for example, power Metal Oxide Semiconductor Field Effect Transistors (MOSFET), bipolar junction transistors (BJT), Insulated Gate Bipolar Transistors (IGBT), Junction Barrier Schottky diodes, Gate Turn-Off Transistors (GTO), MOS-controlled thyristors and various other devices. These power semiconductor devices are generally fabricated from wide band-gap semiconductor materials, such as silicon carbide (SiC) or gallium nitride (GaN) based semiconductor materials. Herein, a wide band-gap semiconductor material refers to a semiconductor material having a band-gap greater than about 1.40 eV, for example, greater than about 2 eV.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure. For example, in a vertical MOSFET device, the source may be on the top surface of the semiconductor layer structure and the drain may be on the bottom surface of the semiconductor layer structure. As another example, power Schottky diodes typically have a vertical structure where the anode contact is formed on a first major surface (e.g., the top surface) of a semiconductor layer structure, and the cathode contact is formed on the other major surface (e.g., the bottom surface). Vertical structures are typically used in very high power applications, as the vertical structure allows for a thick semiconductor drift layer or region that can support high current densities and block high voltages. The semiconductor layer structure may or may not include an underlying substrate. Herein, the term "semiconductor layer structure" refers to a structure that includes one or more semiconductor layers, such as semiconductor substrates and/or semiconductor epitaxial layers.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. For example, a SiC trench MOSFET may provide an inherent lower specific on-resistance due to obtaining a relatively narrow cell pitch by implementing the channel area on the sidewalls of the trench. Channel mobility on the trench sidewalls may also be significantly (e.g., two to four times) greater than the planar Si-face, resulting in enhanced current density. Gate trench MOSFETs may thus provide enhanced performance, but typically require a more complex manufacturing process.

More generally, a conventional power semiconductor device typically includes a semiconductor substrate, such as a silicon carbide substrate, having a first conductivity type (e.g., an n-type substrate) on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction, such as a p-n junction or a Schottky junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" structures that are disposed in parallel to each other and that together can function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or all of the active region of a power semiconductor device. These edge terminations may spread the electric field out over a greater area, thereby reducing the electric field crowding.

SUMMARY

According to some embodiments of the present disclosure, a power semiconductor device includes a semiconductor layer structure comprising a semiconductor drift region of a first conductivity type, and an edge termination region comprising a plurality of guard rings of a second conductivity type. One or more of the guard rings extend into a surface of the semiconductor drift region to respective depths of greater than about 1 micrometers ($\mu$m), and are laterally separated from one another by respective spacings of less than about 3 $\mu$m.

In some embodiments, the one or more of the guard rings respectively comprise a first portion adjacent the surface and a second portion spaced from the surface, where the first portion is wider than the second portion.

In some embodiments, the second portion comprises a higher concentration of dopants of the second conductivity type than the first portion.

In some embodiments, the first portion extends into the surface to a first depth, and wherein the second portion extends through the first portion to a second depth that is greater than the first depth.

In some embodiments, the one or more of the guard rings respectively comprise a third portion comprising a higher concentration of dopants of the second conductivity type than the second portion.

In some embodiments, the third portion is narrower than the first portion.

In some embodiments, the third portion is confined within the first portion in two or more dimensions.

In some embodiments, the one or more of the guard rings respectively comprise a sidewall comprising a step difference between the first and second portions.

In some embodiments, the step difference is defined at an interface between portions of the guard rings comprising different dopant concentrations.

In some embodiments, the semiconductor layer structure further comprises an active region comprising a plurality of well regions of the second conductivity type in the semiconductor drift region, where the well regions extend to the first depth.

In some embodiments, the active region further comprises a plurality of shielding patterns comprising a higher concentration of dopants of the second conductivity type than the well regions, where the shielding patterns extend to the second depth.

In some embodiments, the respective spacings are substantially uniform between the first portions.

In some embodiments, the respective depths are about 1 $\mu$m to about 3 $\mu$m, and wherein the respective spacings are about 0.5 $\mu$m to about 3 $\mu$m.

In some embodiments, the one or more of the guard rings respectively comprise a first width adjacent the surface and a second width spaced from the surface, and a ratio of the first width to the second width is about 0.95 to about 2.

According to some embodiments of the present disclosure, a power semiconductor device includes a semiconductor layer structure comprising a semiconductor drift region of a first conductivity type, and an edge termination region comprising a plurality of guard rings of a second conductivity type that extend into a surface of the semiconductor drift region. One or more of the guard rings respectively comprise a first portion adjacent the surface and a second portion spaced from the surface, where the first portion is wider than the second portion.

In some embodiments, the second portion comprises a higher concentration of dopants of the second conductivity type than the first portion.

In some embodiments, the first portion extends into the surface to a first depth, and the second portion extends through the first portion to a second depth that is greater than the first depth.

In some embodiments, the one or more of the guard rings respectively comprise a third portion comprising a higher concentration of dopants of the second conductivity type than the second portion, and the third portion is narrower than the first portion.

In some embodiments, the one or more of the guard rings are laterally separated from one another by respective spacings, wherein the respective spacings are substantially uniform between the first portions.

In some embodiments, the one or more of the guard rings respectively comprise a sidewall comprising a step difference between the first and second portions.

According to some embodiments of the present disclosure, a power semiconductor device includes a semiconductor layer structure comprising a semiconductor drift region of a first conductivity type, and an edge termination region comprising a plurality of guard rings of a second conductivity type that extend into a surface of the semiconductor drift region. One or more of the guard rings respectively comprise a first portion adjacent the surface, a second portion spaced from the surface, and a sidewall, where the sidewall of a respective guard ring comprises a step difference between the first and second portions.

In some embodiments, the second portion comprises a higher concentration of dopants of the second conductivity type than the first portion, and the step difference is defined at an interface between the first and second portions.

In some embodiments, the first portion is wider than the second portion.

In some embodiments, the first portion extends into the surface to a first depth, and the second portion extends through the first portion to a second depth that is greater than the first depth.

In some embodiments, the semiconductor layer structure further comprises an active region comprising a plurality of well regions of the second conductivity type in the semiconductor drift region, where the well regions extend to the first depth.

In some embodiments, the active region further comprises a plurality of shielding patterns comprising a higher concentration of dopants of the second conductivity type than the well regions, where the shielding patterns extend to the second depth.

In some embodiments, the one or more of the guard rings respectively comprise a third portion comprising a higher concentration of dopants of the second conductivity type than the second portion, where the third portion is narrower than the first portion.

In some embodiments, the one or more of the guard rings extend into the surface of the semiconductor drift region to respective depths of about 1 $\mu$m to about 3 $\mu$m, and are laterally separated from one another by respective spacings of about 0.5 $\mu$m to about 3 $\mu$m.

In some embodiments, the respective spacings are substantially uniform between the first portions.

In some embodiments, the first portion has a first width and the second portion has a second width, and a ratio of the first width to the second width is about 0.95 to about 2.

According to some embodiments of the present disclosure, a power semiconductor device includes a semiconductor layer structure comprising a semiconductor drift region of a first conductivity type, and an edge termination region comprising a plurality of guard rings of a second conductivity type that extend into a surface of the semiconductor drift region. One or more of the guard rings respectively comprise a first width adjacent the surface and a second width spaced from the surface, and a ratio of the first width to the second width is about 0.95 to about 2.

In some embodiments, the one or more of the guard rings respectively comprise a first portion comprising the first width and a second portion comprising the second width, where the first portion is wider than the second portion.

In some embodiments, the second portion comprises a higher concentration of dopants of the second conductivity type than the first portion.

In some embodiments, the first portion extends into the surface to a first depth, and the second portion extends through the first portion to a second depth that is greater than the first depth.

In some embodiments, the one or more of the guard rings respectively comprise a third portion comprising a higher concentration of dopants of the second conductivity type than the second portion, where the third portion is narrower than the first portion.

In some embodiments, the one or more of the guard rings respectively comprise a sidewall comprising a step difference between the first and second portions.

In some embodiments, the one or more of the guard rings extend into the surface of the semiconductor drift region to respective depths of about 1 µm to about 3 µm, and are laterally separated from one another by respective spacings of about 0.5 µm to about 3 µm.

In some embodiments, the respective spacings are substantially uniform between the first portions.

In some embodiments, the ratio is about 0.95 to about 1.05.

In some embodiments, the ratio is about 0.99 to about 1.01.

According to some embodiments of the present disclosure, a method of fabricating a power semiconductor device includes providing a semiconductor layer structure comprising a semiconductor drift region of a first conductivity type; and forming a plurality of guard rings of a second conductivity type in the semiconductor drift region to form an edge termination region. Forming the guard rings comprises sequentially performing first and second ion implantation processes using first and second mask patterns on the semiconductor drift region, respectively, where the first mask pattern comprises openings of a different width than the second mask pattern.

In some embodiments, forming the guard rings comprises performing the first ion implantation process using the first mask pattern to form first portions of the guard rings adjacent a surface of the semiconductor drift region; and performing the second ion implantation process using the second mask pattern to form second portions of the guard rings spaced from the surface. The openings in the second mask pattern are narrower than the openings in the first mask pattern, and the second portions comprise a higher concentration of dopants of the second conductivity type than the first portions.

In some embodiments, the second ion implantation process comprises a greater implantation energy than the first ion implantation process.

In some embodiments, the second mask pattern comprises a greater thickness than the first mask pattern.

In some embodiments, prior to performing the second ion implantation process, the method includes forming spacers on sidewalls of the second mask pattern to define the openings therein.

In some embodiments, the second ion implantation process is performed after the first ion implantation process, and the spacers overlap boundaries of the first portions of the guard rings in one or more lateral dimensions.

In some embodiments, prior to performing the second ion implantation process, the method includes forming spacers on sidewalls of the first mask pattern to form the second mask pattern on the semiconductor drift region.

In some embodiments, performing the second ion implantation process using the second mask pattern comprises forming third portions of the guard rings, where the third portions comprise a higher concentration of the dopants of the second conductivity type than the second portions.

In some embodiments, the third portions are confined within the first portions in two or more dimensions.

In some embodiments, the first portions extend to into the surface to a first depth, and the second portions extend through the first portions to a second depth that is greater than the first depth.

In some embodiments, the semiconductor layer structure further comprises an active region, and performing the first ion implantation process using the first mask pattern comprises forming a plurality of well regions of the second conductivity type extending into the surface of the semiconductor drift region in the active region to the first depth.

In some embodiments, performing the second ion implantation process using the second mask pattern comprises forming a plurality of shielding patterns comprising a higher concentration of dopants of the second conductivity type than the well regions and extending into the surface of the semiconductor drift region in the active region to the second depth.

In some embodiments, the guard rings are laterally separated from one another by respective spacings, and the respective spacings are substantially uniform between the first portions.

In some embodiments, the respective spacings are non-uniform between the second portions.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

A power semiconductor device may include a p-n and/or Schottky junction, which acts as a main junction for blocking voltage in the reverse bias direction and providing current flow in the forward bias direction, and an edge termination adjacent the main junction. For example, a junction termination extension (JTE) region may be formed by ion implantation to define regions of the opposite conductivity type, may surround the main junction. A purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other edge terminations include guard rings and floating field rings (FFR).

Some embodiments of the present disclosure may arise from recognition of limitations of in edge terminations of some existing power semiconductor devices. Power semiconductor devices may include layers having a first (n- or p-) conductivity type, and regions having second (p- or n-) conductivity type within the layers at deeper levels (e.g., about 1-5 microns or more) from the upper surface of the device. Forming such deep patterns may typically be implemented by ion implantation, as epitaxial- and/or diffusion-based techniques for introducing dopants may pose challenges in silicon carbide or other wide band-gap semiconductor materials.

For example, it may be desirable to form deep or "buried" shielding semiconductor regions, also referred to as shielding patterns, of a different conductivity type than the layer(s) of the semiconductor material underneath the well regions and/or gate electrodes of the device. The edge termination of the device may likewise include deep shielding patterns (e.g., formed by deep ion implantation) to provide a smooth field between the termination and active area. However, forming such patterns using high energy implantation may result in lateral extension (or "straggle") between adjacent implant regions, which may electrically connect adjacent implant features.

Some embodiments described herein provide multiple sequential mask and implant processes to implement both deep and shallow implantation in the edge termination, which may be beneficial for particular semiconductor materials, designs and/or fabrication processes. Although described and illustrated herein with reference to regions of specific conductivity types (i.e., n-type and p-type) by way of example, it will be understood that the conductivity types of the regions may be reversed (i.e., p-type and n-type) in accordance with embodiments of the present disclosure.

Figure 1A:
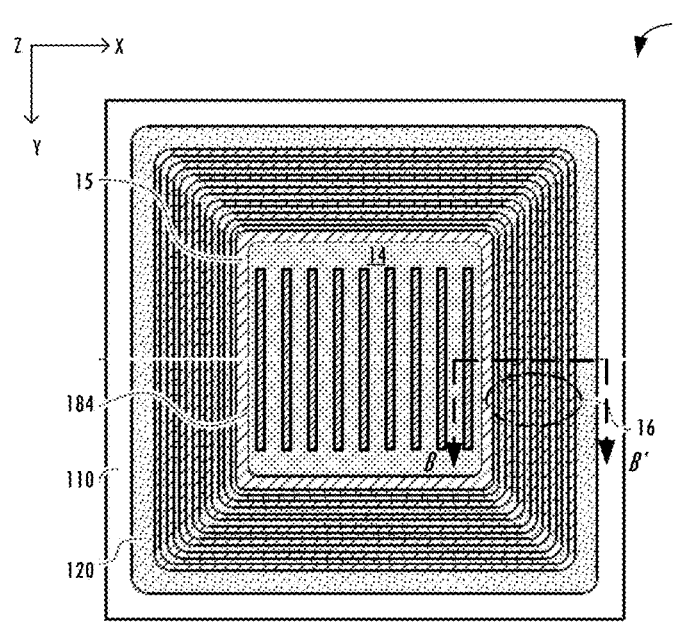
FIG. 1A is a schematic plan view of a power semiconductor device according to some embodiments of the present disclosure.
Figure 1B:
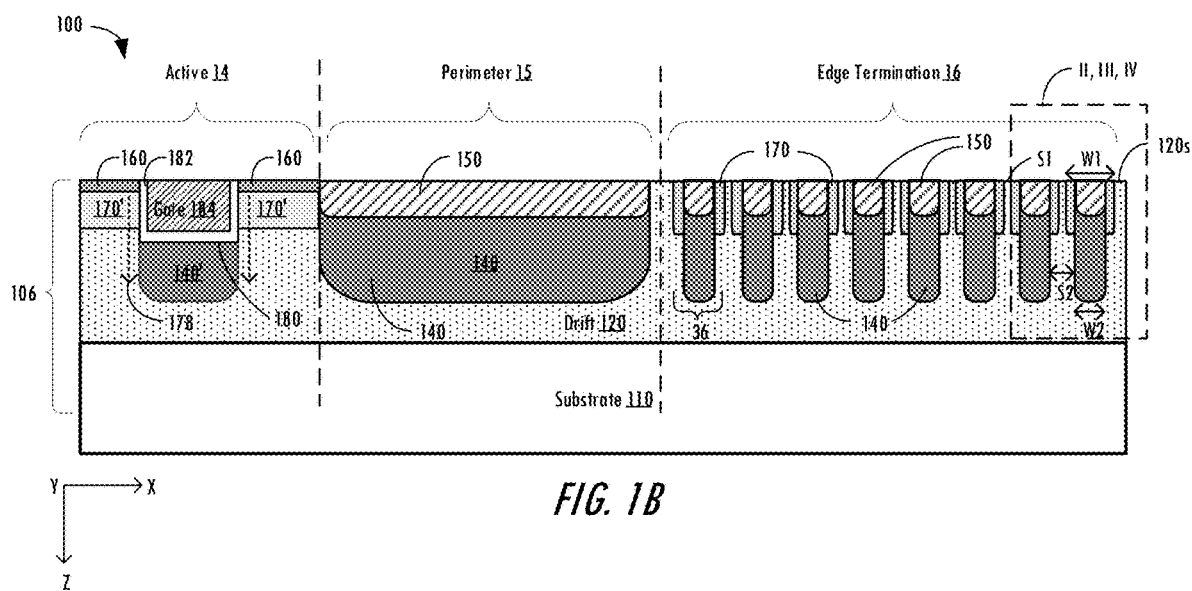
FIG. 1B is a schematic cross sectional view of a power semiconductor device according to some embodiments of the present disclosure taking a long line B-B' of FIG. 1A.

FIG. 1A is a schematic plan view of a power semiconductor device 100 in accordance with some embodiments of the present disclosure. FIG. 1B is an enlarged schematic cross-sectional view of a portion of the power semiconductor device 100 taken along line B-B' of FIG. 1A. The power semiconductor device 100 is illustrated as a trenched gate vertical power MOSFET by way of example only, but may be, for example, a planar gate power MOSFET, a Schottky diode, a power IGBT, or other power semiconductor device. The power semiconductor device 100 has a "unit cell" structure in which the active region includes a plurality of individual devices that are disposed in parallel to each other and that together function as a single power device.

As shown in FIGS. 1A and 1B, the power semiconductor device 100 includes a substrate 110 in which an active region 14 is defined within an edge termination region 16, with a perimeter region 15 extending between the active region 14 and the edge termination region 16. The edge termination region 16 may help reduce undesired electric field crowding effects that may occur at the edges of the active region 14. The edge termination region 16 may, but does necessarily, completely or substantially surround the active region 14.

The substrate 110 may be a heavily-doped (e.g., $n^+$) substrate. A lightly-doped (e.g., n) semiconductor drift layer or drift region 120 is provided on the substrate 110. In some embodiments, an upper portion of the drift region 120 may include a current spreading layer ("CSL"). Moderately-doped regions of the opposite conductivity type (e.g., p) is formed (for example, by epitaxial growth or implantation) on the drift region 120 and acts as the well regions or wells 170' (e.g., p-type wells or "p-wells") for the device 100. The substrate 110, drift region 120 (including current spreading layer), and the moderately doped regions defining the well regions 170, along with the various regions/patterns formed therein, are included in a semiconductor layer structure 106 of the power semiconductor device 100.

The semiconductor layer structure 106 may include wide band-gap semiconductor materials. In the example power semiconductor device 100, the substrate 110 and the drift layer 120 are silicon carbide (SiC)-based, for example, a SiC substrate 110 and a SiC drift layer 120 epitaxially grown thereon with a uniform or graded doping concentration. The substrate 110 and the drift layer 120 are not limited to SiC, and may be formed from other material systems, such as, for example, Group III nitrides (e.g., GaN), gallium arsenide (GaAs), silicon (Si), germanium (Ge), silicon germanium (SiGe), and the like.

As shown in FIGS. 1A and 1B, trenches 180 are formed in the semiconductor layer structure 106 with "striped" gate trench layouts, in which the trenches 180 continuously extend in parallel to one another in a longitudinal (e.g., Y-) direction. The trenches 180 (in which the gates electrodes 184 are formed) extend through the moderately-doped regions 170 to define the wells. Heavily-doped (e.g., p-type) shielding patterns 140' are formed in the drift region 120, for example, by ion implantation into portions exposed by the trenches 180, also referred to as deep shielding patterns 140'. The shielding patterns 140' may be in electrical connection with the wells 170'. A gate insulating layer 182 is formed on the bottom surface and sidewalls of the trenches 180.

A gate electrode 184 (or "gate") is formed on each gate insulating layer to fill the respective gate trenches 180. Transistor conduction channels (shown by dashed arrows 178) are provided in the well regions 170 adjacent the gate insulating layer 182. Heavily-doped (e.g., $n^+$) source regions 160 extend in upper portions of the well regions 170', for example, as formed via ion implantation. Source contacts may be formed on the heavily-doped source regions 160. The source contacts may be ohmic metal in some embodiments. A drain contact may be formed on the lower surface of the substrate 110, for example, opposite the drift region 120. A gate contact may be formed on each gate electrode 184. The source, drain, and gate contacts are not shown for ease of illustration.

The edge termination region 16 includes a plurality of guard rings 36. The guard rings 36 may be formed by heavily doping the corresponding portions of the drift layer 120 with a doping material of a second, opposite conductivity type than the drift layer 120, and may be implemented as concentric rings in the edge termination region 16 around the active region 14 of the device 100. The guard rings 36 may be formed, for example, by ion implantation. The guard rings 36 may be electrically isolated from one another (e.g., by lateral gaps or spacings S1, S2 as described herein) and from other features of the device 100. The guard rings 36 may have an electrically floating state. As shown in FIG. 1B, in some embodiments, the edge termination region 16 may include guard rings 36 extending into the surface 120s (e.g., in the Z direction) with first, wider portions 170 adjacent the surface 120s (also referred to as upper guard ring portions) and second, narrower portions 140 opposite (e.g., below or spaced from) the surface 120s (also referred to as lower guard ring portions).

In some embodiments, the upper and lower guard ring portions 170 and 140 may be formed using multiple masks and implantation operations, for example, as described below with reference to FIGS. 5A to 8F. While illustrated as substantially rectangular, the edge termination region 16 and/or the guard rings 36 may be of any shape and will generally correspond to the shape of the periphery of the active region 14, which is rectangular in the illustrated embodiments. Each of these elements may continuously or discontinuously extend around the active region 14. Also, it will be understood that the edge termination region 16 may be substantially coplanar with the top surface 120s of the drift layer 120, or may be non-coplanar (e.g., protruding from or recessed) relative to the top surface 120s of the drift layer 120.

The perimeter region 15 may be provided between the guard rings 36 and the outer periphery of the active region 14, and may include some but not all features corresponding to those of the active region 14 and/or the edge termination 16. For example, the perimeter region 15 may include the deep shielding patterns 140 and/or heavily doped regions 150 of the active region 14 and the edge termination 16. However, the perimeter region 15 may not include or may be free of the well regions 170', e.g., based on sequential masking and implantation operations as described herein.

As noted above, FIGS. 1A and 1B illustrate example embodiments with reference to (but not limited to) vertical MOSFET devices, and in particular, trenched gate MOSFET devices. Trenched gate MOSFET vertical power devices 100 may inherently have a lower specific on resistance (e.g., in comparison to planar gate devices) due to a narrow cell pitch by implementing the channel regions 178 along the sidewalls of the trenches 180. Moreover, the channel mobility on the sidewalls of the trench 180 may be higher (e.g., by about 2-4 times) than the planar Si-face, resulting in an enhanced current density.

Various fabrication methods may be used to achieve trenched gate MOSFETs. In the example of FIG. 1B, a highly doped (e.g., p+) or high-concentration implant region 140' (also referred to as a shielding pattern) may be provided using high energy (e.g., MeV) implantation. This structure may allow for aggressive cell pitch reduction and sidewall conductivity utilization at both of the opposing sidewalls of the trenches 180.

The edge termination 16 of the device may likewise include similar deep or buried shielding patterns 140 and high-concentration implantation regions 150 to provide a smooth field between the edge termination 16 and active region 14. However, the high energy implantation may result in lateral extension or "straggle" between adjacent implant regions 150, which may be particularly problematic in implementations where there may be a narrow lateral spacing S1 between implant features, such as the guard rings 36 of the edge termination 16.

FIGS. 2A-2B, 3A-3B, and 4A-4B are enlarged schematic cross sectional views of guard ring structures (also referred to herein as guard rings) according to some embodiments of the present disclosure. Each guard ring structure may include multiple dopant concentrations and feature sizes (e.g. widths and/or depths), so as to reduce or avoid lateral straggle and maintain electrical isolation of adjacent and/or concentric guard rings, while maintaining the desired field effects. In some embodiments, the respective dopant concentrations and/or feature dimensions may be achieved using multiple sequential mask processes, e.g., to implement sequential deep and shallow implantation processes.

As shown in the examples of FIGS. 2A-2B, 3A-3B, and 4A-4B, portions of a drift region 120 of a first (e.g., n-type) conductivity type may include a plurality of guard rings 36 of a second (e.g., p-type) conductivity type to define the edge termination region 16. The guard rings 36 extend into a surface 120s of the semiconductor drift region 120 (e.g., in the Z direction) to respective depths D2 of greater than about 1 micrometers (μm). The guard rings are laterally separated from one another (e.g., in the X and/or Y directions) by respective spacings S1a, S1b (collectively S1) of less than about 3 μm adjacent the surface 120s. The guard rings 36 may respectively include multiple portions (e.g., 170, 140, 150) with different depths (e.g., D1, D2), different lateral spacings (e.g., S1, S2), and/or different concentrations (e.g., as shown by differences in shading and/or hatching) of dopants of the second conductivity type.

In greater detail, the guard rings 36 include first portions 170 adjacent the surface 120s of the drift region, and second portions 140 spaced from the surface 120s. The first portions 170 are laterally separated from one another by respective spacings S1 adjacent the surface 120s, while the second portions 140 are laterally separated from one another by respective spacings S2, S2', S2" (collectively S2) spaced from the surface 120s. The spacings S1 and S2 may be sufficient to maintain electrical isolation between adjacent and/or concentric guard rings 36.

In some embodiments, the first portions 170 of the guard rings 36 in the edge termination region 16 may be formed concurrently with or may otherwise correspond to the well regions 170' in the active region 14, and thus may include a similar concentration of dopants of the second conductivity type as the well regions 170. The first portions 170 have respective widths W1a, W1b (collectively W1) and are laterally separated from one another by respective spacings S1 adjacent the surface 120s, and extend into the surface 120s to respective depths D1. As used herein, the widths W1, W2 may be measured along a same lateral direction as the spacings S1, S2 (e.g., in the X- or Y-directions). The depths D1, D2 may be measured along a vertical direction relative to the surface 120s (e.g., in the Z-direction). For example, the respective spacings S1 between the guard rings 36 adjacent the surface 120s may be about 3 μm to about 0.5 μm, e.g., about 2 μm to about 0.8 μm, or about 1.5 μm to 1 μm. The respective widths W1 of the first portions 170 of the guard rings 36 adjacent the surface 120s may be about 3 μm to about 0.5 μm, e.g., about 2.5 μm to about 0.5 μm, or about 1.5 μm to 1 μm. The respective depths D1 of the first portions 170 of the guard rings 36 may be about 3 μm to about 1 μm, e.g., about 2.5 μm to about 1.5 μm, or about 1.5 μm to 1 μm.

In some embodiments, the second portions 140 of the guard rings 36 in the edge termination region 16 may be formed concurrently with or may otherwise correspond to the shielding regions 140' in the active region 14 and/or in the perimeter region 15. The second portions 140 may have a higher concentration of the second conductivity type dopants than the first portions 170, e.g., similar to that of the shielding regions 140'. The second portions 140 have respective widths W2, W2', W2''' (collectively W2) and are laterally separated from one another by respective spacings S2, S2', S2'' (collectively S2) spaced from the surface 120s, and extend into the surface 120s (within or through the first portions 170) to respective depths D2. For example, the respective spacings S2 between the guard rings 36 spaced from the surface 120s may be about 3 μm to about 0.5 μm, e.g., about 2 μm to about 0.8 μm, or about 1.5 μm to 1 μm. The respective widths W2 of the second portions 140 of the guard rings 36 spaced from the surface 120s may be about 3 μm to about 0.5 μm, e.g., about 2.5 μm to about 0.5 μm, or about 1.5 μm to 1 μm. The respective depths D2 of the second portions 140 of the guard rings 36 may be about 1 μm to about 5 μm, e.g., about 2 μm to about 4 μm, or about 2.5 μm to 3.5 μm.

Figure 2A:
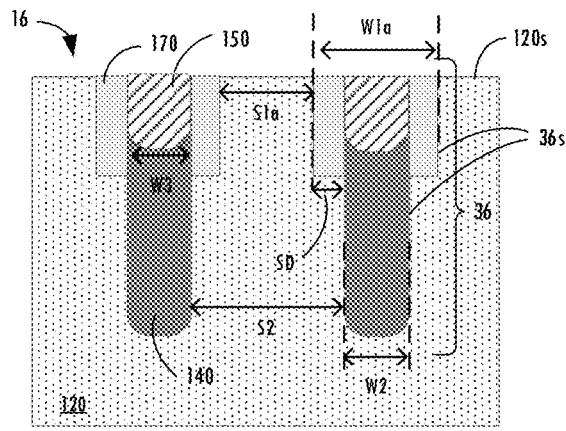
FIGS. 2A and 2B are enlarged schematic cross sectional views of guard ring structures according to some embodiments of the present disclosure.
Figure 2B:
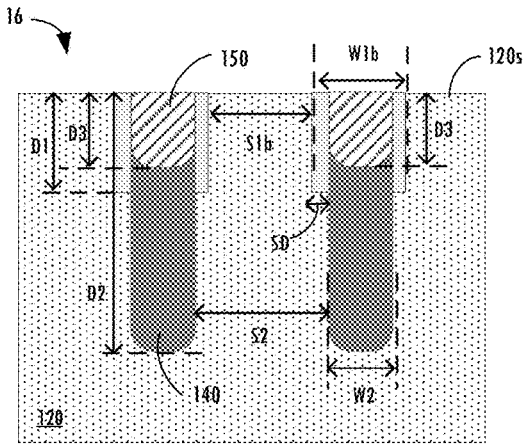
Figure 3A:
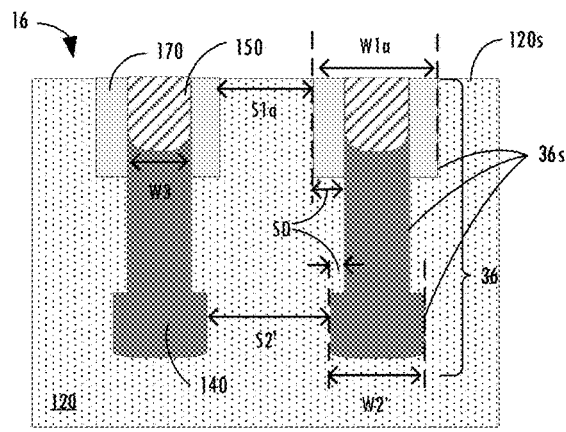
FIGS. 3A and 3B are enlarged schematic cross sectional views of guard ring structures according to some embodiments of the present disclosure.
Figure 3B:
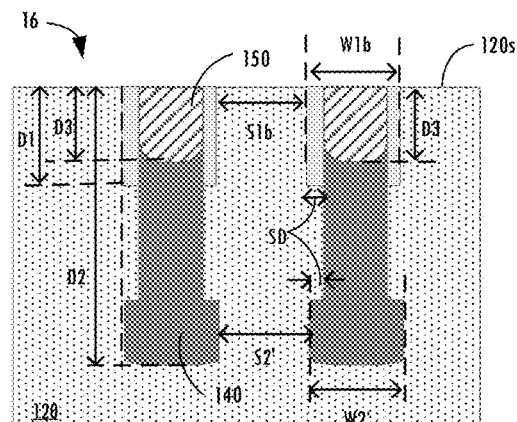

In some embodiments, the respective lateral spacings S1 between the first portions 170 of the guard rings 36 may be less than the lateral spacings S2 between the second portions 140, for example, as shown in FIGS. 2A, 2B, 4A, and 4B. In other embodiments, the respective lateral spacings S1 between the first portions 170 of the guard rings 36 may be approximately equal to or greater than the lateral spacings S2' between the second portions 140, for example, as shown in FIGS. 3A and 3B. The respective widths W1 of first portions 170 of the guard rings 36 may be substantially uniform over the respective depths D1. As such, the lateral spacings S1 between the first portions 170 of adjacent guard rings may likewise be substantially uniform over the respective depths D1.

In some embodiments, the respective widths W1 of first portions 170 of the guard rings 36 may be wider than the respective widths W2 of the second portions 140. In other embodiments, the respective widths W1 of the first portions 170 of the guard rings 36 may be approximately equal to or narrower than the respective widths W2 of the second portions 140. For example, a ratio of the width W1 of the first portions 170 to the width W2 of the second portions 140 may be about 0.95 to about 2 (i.e., W1:W2=about 0.95:about 2.0). In some embodiments, the width W1 of the first portions 170 and the width W2 of the second portions may be approximately equal or uniform, for example, with a ratio of W1:W2 of about 0.95:about 1.05, or about 0.99:about 1.01.

Still referring to FIGS. 2A-2B, 3A-3B, and 4A-4B, the guard rings 36 may further include third portions 150 extending into the surface 120s of the drift region. The third portions 150 may be formed concurrently with or may otherwise correspond to the high-concentration regions 150 in the perimeter region 15. The third portions 150 may have a higher concentration of the second conductivity type dopants than the second portions 140. For example, the third portions 150 of the guard rings 36 may have a dopant concentration of about $1 \times 10^{17}$ to about $1 \times 10^{20}/cm^3$ (e.g., for p-type regions). The second portions 140 may have a dopant concentration in the same or similar range, but less than the third portions 150 (e.g., a dopant concentration of about $1 \times 10^{17}$ to about $5 \times 10^{19}/cm^3$ for p-type regions). The first portions 170 of the guard rings may have a dopant concentration in the same or similar range, but less than the second portions 140 (e.g., a dopant concentration of about $1 \times 10^{17}$ to about $1 \times 10^{19}/cm^3$ for p-type regions).

The third portions 150 may have respective widths W3 and/or depths D3 that are less than the respective widths W1 and depths D1 of the first portions 170. In some embodiments, the third portions 150 may be confined within the first portions 170 in two or more dimensions (e.g., in multiple lateral dimensions and/or in the depth dimension). For example, the first portions 170 and the third portions 150 may be implanted into the surface 120s using respective mask features and/or implantation operations so as to avoid lateral "straggle" (and resulting electrical connection) of adjacent guard rings 36. As such, the guard rings 36 may be electrically isolated regions of a different conductivity type than the drift region 120, and may respectively include two, three, or more portions with different dopant concentrations, may be laterally separated from one another by two, three or more different spacings along the depth dimension, and/or may extend into the surface 120s of the drift region 120 to two, three, or more different depths.

The guard rings 36 may also be formed with different shapes. For example, as shown in FIGS. 2A and 2B, the second portions 140 of the guard rings may be formed with sidewalls that extend with a substantially uniform width W2 over the depth D2, e.g., to define a "U"-shape in cross section extending within and beyond the first portions 170. Alternatively, as shown in FIGS. 3A-3B and 4A-4B, the second portions 140 of the guard rings may be formed with sidewalls that vary in width W2' and W2" over the depth D2, e.g., to define an inverted mushroom-shape and "V"-shape in cross section, respectively. The width W2 may vary over the depth D2, for example, by about 0.25 μm to about 1.25 μm, e.g., about 0.5 μm to about 1 μm, or about 0.6 μm to 0.9 μm. As such, the spacings S2 between the second portions 140 of adjacent guard rings 36 may be substantially uniform or may be non-uniform.

Figure 4A:
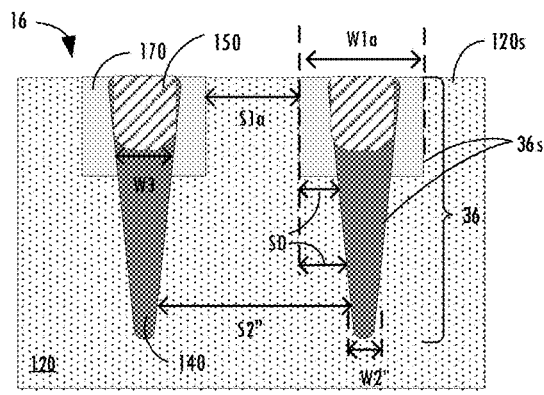
FIGS. 4A and 4B are enlarged schematic cross sectional views of gardening structures according to some embodiments of the present disclosure.
Figure 4B:
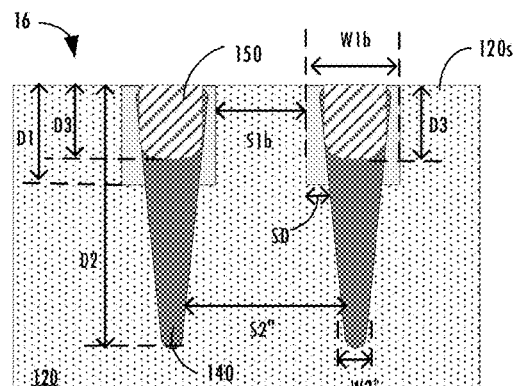

In particular, FIGS. 2A-2B illustrate that the widths W2 of the second portions 140 (and thus, the lateral spacings S2 therebetween) may be substantially uniform over the respective depths D2. FIGS. 3A-3B illustrate that the widths W2' of the second portions 140 (and thus, the lateral spacings S2' therebetween) may be non-uniform over the depths D2, shown by way of example with lower regions of the second portion 140 being wider than upper regions thereof. FIGS. 4A-4B illustrate that the widths W2" of the second portions 140 (and thus, the lateral spacings S2" therebetween) may continuously vary over the depths D2, shown by way of example with widths W2" that continuously decrease with distance from the surface 120s. The widths W1 of the first portions 170 (and thus, the lateral spacings S1 therebetween) may be substantially uniform over the respective depths D1.

The differences in widths of the first portions 170, second portions 140, and/or third portions 150 of the guard rings 36 may define guard ring side surfaces 36s (also referred to herein as sidewalls) that are non-uniform in width or profile along the depth direction. As such, the sidewalls 36s may include one or more step differences SD based on the differences in width between the respective portions 170, 140, and/or 150 of the guard rings 36. For example, as shown in FIGS. 2A, 3A, and 4A, the differences between the width W1 of the first portion 170 adjacent the surface 120s and the width W2 of the second portion spaced from the surface 120s may define a step difference SD along the sidewall 36s of the guard ring 36. Step differences as described herein may thus refer to any changes in width between the respective portions of the guard rings 36, including gradual or other non-abrupt changes in width, and are not limited to abrupt or step changes. The step differences SD may thus range from about 0.5 μm to about 2 μm, e.g., about 0.75 μm to about 1.75 μm, or about 1 μm to 1.5 μm. As noted above, as the second portion 140 may have a higher dopant concentration than the first portion 170, such that the step difference SD is defined at an interface between portions of the guard rings 36 having different dopant concentrations.

The guard rings 36 may be formed with different concentrations, depths, and/or widths using multiple masks and/or implantation operations. For example, as shown in FIG. 9 and described in detail below with reference to FIGS. 5A-5F, 6A-6H, 7A-7H, and 8A-8F, a semiconductor layer structure 106 including semiconductor drift region 120 of a first conductivity type may be provided at block 905. A plurality of guard rings of a second conductivity type may be formed in the semiconductor drift region to define the edge termination region 16 at block 915. The guard rings 36 may be formed by sequentially performing two or more ion implantation processes using two or more mask patterns that define openings of different widths on the semiconductor drift region 120, respectively. For example, the edge termination regions 16 may be formed using thinner mask patterns with wider openings for a shallower implant with lower energy (e.g., less than about 1.0 MeV) to define lateral boundaries (with respective widths W1) of the implanted regions 170 adjacent the surface 120s of the drift region 120 with the desired spacing S1, and using thicker mask patterns with narrower openings for a deeper implant with higher energy (e.g. about 1.0 MeV to about 2.0 MeV) to define junction depths D2 of the implanted regions 140 within the edge termination region 16. In some embodiments, the junction depths D2 in the edge termination region 16 may be the same as (i.e., matched with) the junction depths D2 of the shielding patterns 140' in the active region 14.

Methods of fabricating power semiconductor devices in accordance with some embodiments are described below. In these example, only the drift region (or portions thereof) are shown for ease of illustration, but it will be understood that the illustrated semiconductor layer structures may include a substrate and additional semiconductor layers of a first conductivity type that are provided on the substrate, e.g., by epitaxial growth. The semiconductor layer structure may include wide band-gap semiconductor materials, including but not limited to SiC substrates and SiC drift layers that are epitaxially grown thereon with a uniform or graded doping concentration.

Figure 5A:
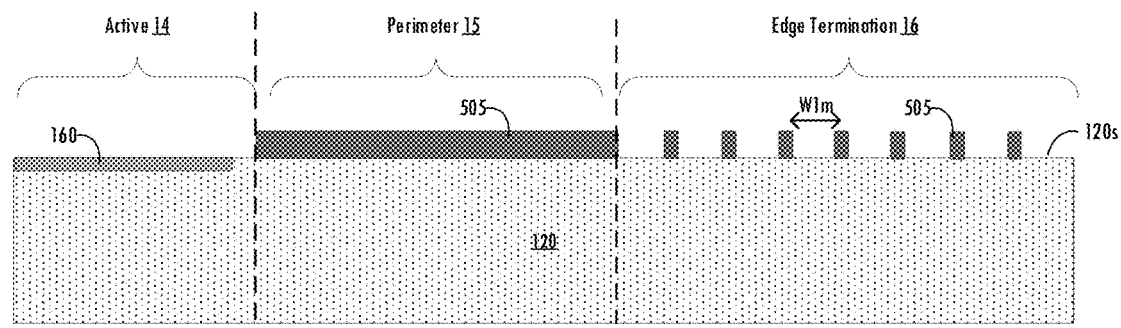
FIGS. 5A, 5B, 5C, 5D, 5E, and 5F are schematic cross sectional views illustrating example operations in methods of fabricating a power semiconductor device according to some embodiments of the present disclosure.

FIGS. 5A-5F are schematic cross sectional views illustrating example operations in methods of fabricating a power semiconductor device according to some embodiments of the present disclosure. As shown in FIG. 5A, a lightly-doped (e.g., n−) semiconductor drift region 120 of the first conductivity type is formed on a semiconductor substrate via epitaxial growth. A current spreading layer of the first conductivity type may be formed in the upper portion of the drift layer 120. The drift region 120 includes an active region 14, an edge termination region 16, and a perimeter region 15 extending between the active region 14 and the edge termination region 16. Heavily-doped (e.g., n+) source regions 160 are formed in upper portions of the active region 14, for example, via masking and ion implantation.

Still referring to FIG. 5A, a first mask pattern 505 is formed on a surface 120s of the drift region 120. The first mask pattern 505 may be a relatively thin layer (e.g., a nitride or oxide layer, such as Sift), for example, having a thickness of about 0.75 μm to about 2.25 μm, for example, about 1 μm to about 2 μm. The first mask pattern 505 covers the surface 120s in the perimeter region 15, but includes openings therein that expose portions of the surface 120s in the active region 14 and the edge termination region 16. The openings in the first mask pattern 505 in the edge termination region 16 have respective widths W1m that expose portions of the surface 120s. In some embodiments, the openings in the first mask pattern 505 in the active region 14 may be sized to define the well regions 170', and the first mask pattern 505 may also be referred to as a well implant mask. For example, the well implant mask 505 may include mask openings with the desired dimensions in the active region 14 (in addition to the mask openings with widths W1n in the edge termination region 16) so both regions 14 and 16 can be implanted at the same time or otherwise using the same implantation mask 505.

Figure 5B:
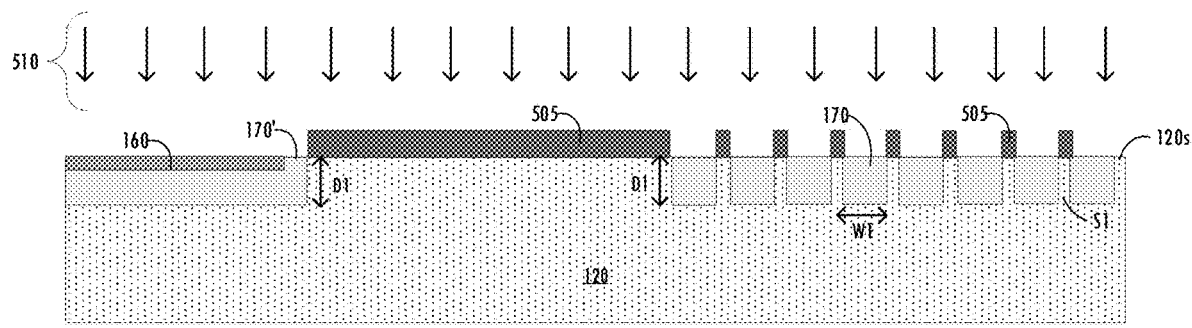

As shown in FIG. 5B, one or more first implantation processes 510 is performed using the first mask pattern 505 as an implantation mask to implant dopants of the second conductivity type (e.g. p-type) into the surface 120s of the drift region 120 exposed by the mask pattern 505 to define first portions 170 of the guard rings 36 in the edge termination region 16, and in some embodiments, well regions 170' in the active region 14. The implanted regions 170, 170' may be moderately-doped, e.g. with a second conductivity-type dopant concentration of about $1 \times 10^{17}$ to about $1 \times 10^{20}$/cm$^3$. The portions of the surface 120s covered by the first mask pattern 505 in the edge termination region 16 may define the lateral spacings S1 between the first portions 170 guard rings 36. The first implantation process(es) 510 may be performed at a relatively lower implantation energy (e.g., about 0.25 MeV to about 1.0 MeV, for example, about 0.5 MeV) to define the implanted regions 170, 170' extending into the surface 120s with relatively shallow depths D1. The spacings S1 between adjacent portions 170 of the guard rings 36 may be substantially uniform over the respective depths D1 in the edge termination region 16. That is, the lower energy implantation 510 using the relatively thin first mask pattern 505 may allow for more precise control over the respective widths W1 of the first portions 170 of the guard rings 36, and thus the respective gaps or narrow lateral spacings S1 between the first portions 170.

Figure 5C:
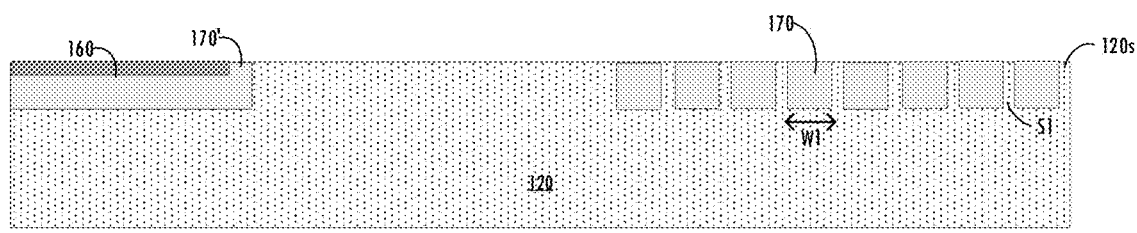
Figure 5D:
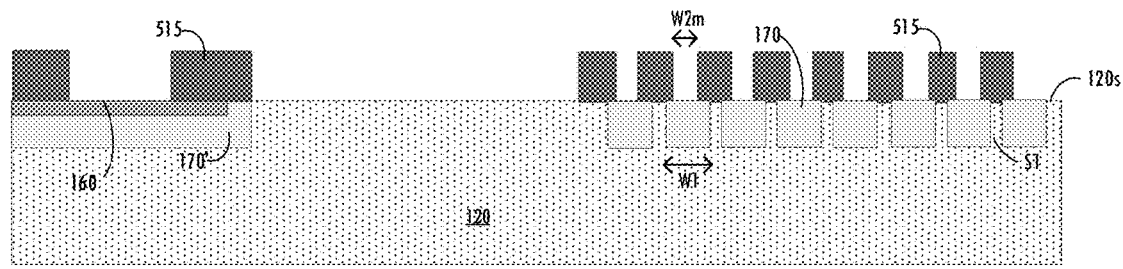

As shown in FIG. 5C, the first mask pattern 505 is removed, and a second mask pattern 515 is formed on a surface 120s of the drift region 120 in FIG. 5D. The second mask pattern 515 may be formed of a relatively thick layer (e.g., a nitride or oxide layer, such as SiO$_2$), for example, having a thickness of about 2 μm to about 5 μm, e.g., about 2.5 μm to about 4 μm. The thickness of the second mask pattern 515 is greater than the thickness of the first mask pattern 505. The second mask pattern 515 includes openings therein that expose portions of the surface 120s in the active region 14, the perimeter region 15, and the edge termination region 16. The openings in the second mask pattern 515 have respective widths W2m that expose portions of the surface 120s in the edge termination region 16. The widths W2m of the openings in the second mask pattern 515 are narrower than the widths W1m of the openings in the first mask pattern 505, and laterally extend beyond edges of the implanted regions 170. In some embodiments, the openings in the second mask pattern 515 in the active region 14 may be sized to define the shielding regions 140', and the second mask pattern 515 may also be referred to as a shielding implant mask. For example, the shielding implant mask 515 may be a few micrometers in thickness, and may include mask openings with the desired dimensions in the active region 14 (in addition to the mask openings with widths W2m in the edge termination region 16) so both regions 14 and 16 can be implanted at the same time or otherwise using the same implantation mask 515. The shielding regions 140' may be a few micrometers in width.

Figure 5E:
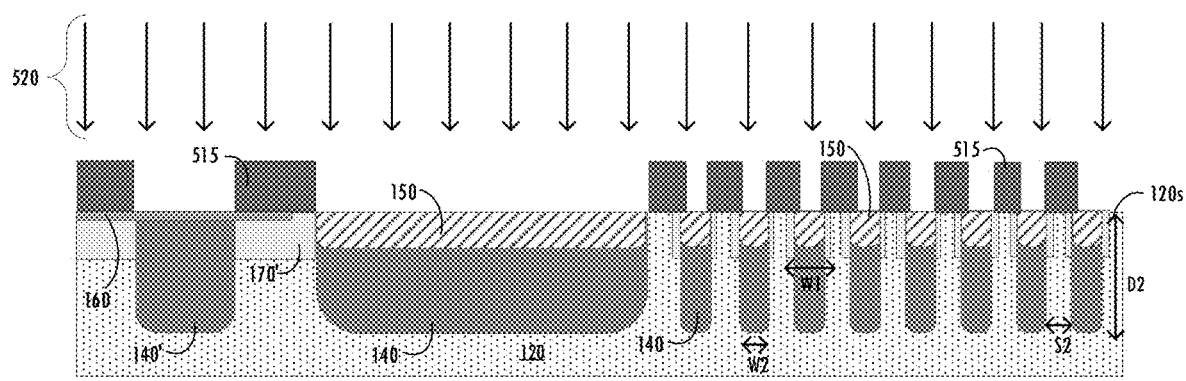

As shown in FIG. 5E, one or more second implantation processes 520 is performed using the second mask pattern 515 as an implantation mask to implant dopants of the second conductivity type (e.g., p-type) into the surface 120s of the drift region 120 exposed by the second mask pattern 515 to define the implanted regions 140, 140', 150 in the edge termination region 16, the perimeter region, and/or the active region 14. The second implantation process(es) 520 may be performed at a relatively higher implantation energies (e.g., about 2 MeV to about 5 MeV, for example, about 3 MeV to about 4 MeV) in comparison to the first implantation process(es) 510 to define implanted regions 140, 140' (also referred to as shield implants) as second portions of the guard rings 36 that extend into the surface 120s with relatively deep depths D2. The depths D2 are greater than the depths D1 of the implanted regions 170, 170' providing the first portions of the guard rings, i.e., the implanted regions 170 are shallower than the implanted regions 140. The second portions 140, 140' may be higher-doped than the first portions 170, 170', e.g. with a second conductivity-type dopant concentration of about $1\times10^{17}$ to about $1\times10^{20}/cm^3$.

The second implantation process 520 may include multiple implantation steps. The second implantation process(es) 520 may also include a lower-energy implantation process to define the implanted regions 150 providing third portions of the guard rings 36. The third portions 150 may have higher concentration regions of the second conductivity type than the second portions 140 (and thus may be referred to as "plus" implants), e.g. with a second conductivity-type dopant concentration of about $1\times10^{17}$ to about $1\times10^{20}/cm^3$, for example, about $1\times10^{18}$ to about $1\times10^{20}/cm^3$. The third portions 150 may be provided within the first portions 170 of the guard rings 36. In some embodiments, the third portions 150 may be confined within one or more dimensions of the first portions 170, for example, within the lateral (e.g., X, Y) and/or depth (e.g., Z) dimensions. The third portions 150 of the guard rings may be formed before or after the second portions 140.

The thickness of the second mask pattern 515, alone or in combination with the widths W2m of the openings therein, may be configured to reduce lateral expansion (or "mushrooming") of portions of the region 140, 150 at the higher implantation energies. That is, as high energy implantation may result in lateral extension between adjacent implant regions 140 and/or 150, embodiments of the present disclosure provide one or more additional mask patterns with greater thickness and/or narrower openings for use with higher-energy implants, which may allow for more precise control over the respective width W2 of the second portions 140 of the guard rings 36 to reduce or avoid lateral extension and resulting electrical contact between adjacent guard rings 36. In particular, the openings W2m in the second mask pattern 515 may be sufficiently narrow such that the second mask pattern W2m covers the edges or boundaries of the first portions 140 of the guard rings 36 that define the desired lateral spacings S1 under higher-energy or other implantation conditions where lateral expansion between adjacent guard rings 36 may occur. In some embodiments, the spacings S2 between adjacent portions 140 of the guard rings 36 may be non-uniform over the respective depths D2 in the edge termination region 16, and in some embodiments may define one or more step differences SD along sidewalls 36s of the guard rings 36 (as shown in FIGS. 2A to 4B).

Figure 5F:
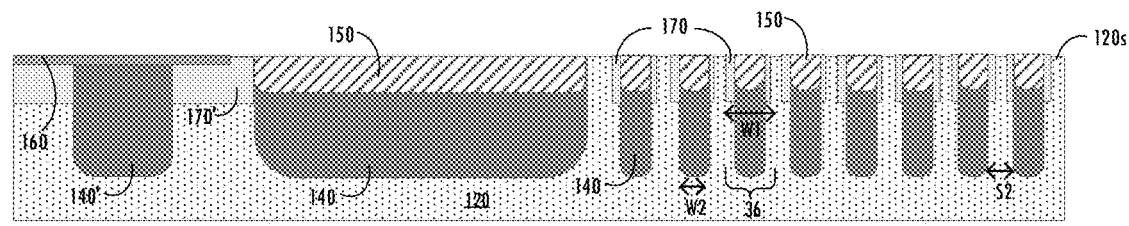

As shown in FIG. 5F, the second mask pattern 515 may be removed from the surface 120s of the drift region 120 after performing the second, higher-energy and/or higher-concentration implantation process(es) 520. Additional masking, etching, and/or deposition steps may be performed to define the gate trenches 180, gate insulating layers 182, and/or gates 184 in the active region 14, as shown in FIG. 1B.

Although illustrated in FIGS. 5A-5F as initially forming the implanted regions 170 using lower-energy implantation 510 and the first mask pattern 505 having wider openings W1m, and subsequently forming the implanted regions 140 and 150 using the higher-energy implantation 520 and the second mask pattern having narrower openings W2m, it will be understood that the portions 140, 150, 170 of the guard rings 36 need not be formed in the sequence shown. For example, in some embodiments the implanted regions 140 and 150 may be initially formed using the higher-energy and/or higher concentration implantation 520 with the second mask pattern having narrower openings W2m, and the implanted regions 170 may be subsequently formed using the lower-energy and/or lower concentration implantation 510 with the first mask pattern 505 having wider openings W1m. More generally, while illustrated herein with reference to fabricating power semiconductor devices using particular sequences of operations, it will be understood that one or more of the operations may be performed out of the sequences or order shown.

FIGS. 6A-6H are schematic cross sectional views illustrating example operations in methods of fabricating a power semiconductor device according to some embodiments of the present disclosure. In particular, while the thicker second mask pattern 515 with narrower openings (having widths W2m) may be used in the high energy implantation process 520 described above, there may be challenges in fabricating such thicker mask patterns 515 with sufficiently narrow openings W2m (e.g., sub-micron widths) to reduce or avoid lateral extension or straggle of the implanted regions 140. Embodiments of the present disclosure as shown in FIGS. 6A to 6H further include a spacer fabrication process that may be used to achieve openings having the desired sub-micron widths. Some aspects of FIGS. 6A-6H may be similar to structures and/or operations discussed above with reference to FIGS. 5A-5F, and thus, description of such similar structures and/or operations may be abridged or omitted.

Figure 6A:
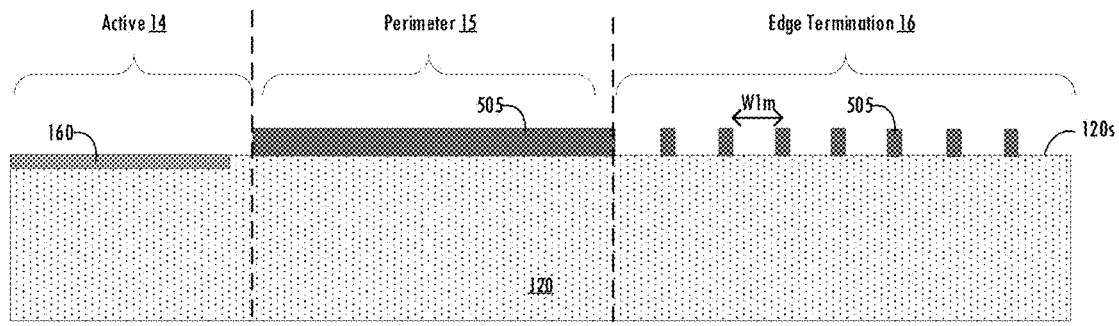
FIGS. 6A, 6B, 6C, 6D, 6E, 6F, 6G, and 6H are schematic cross sectional views illustrating example operations in methods of fabricating a power semiconductor device according to some embodiments of the present disclosure.

As shown in FIG. 6A, the first mask pattern 505 is formed on the surface 120s of the drift region 120 including the active region 14, edge termination region 16, and perimeter region 15 therebetween. The first mask pattern 505 may be relatively thin, and includes openings therein that expose portions of the surface 120s in the active region 14 and the edge termination region 16. The openings in the edge termination region 16 have respective widths W1m, while the openings in the active region 14 may be sized to define the well regions 170'.

Figure 6B:
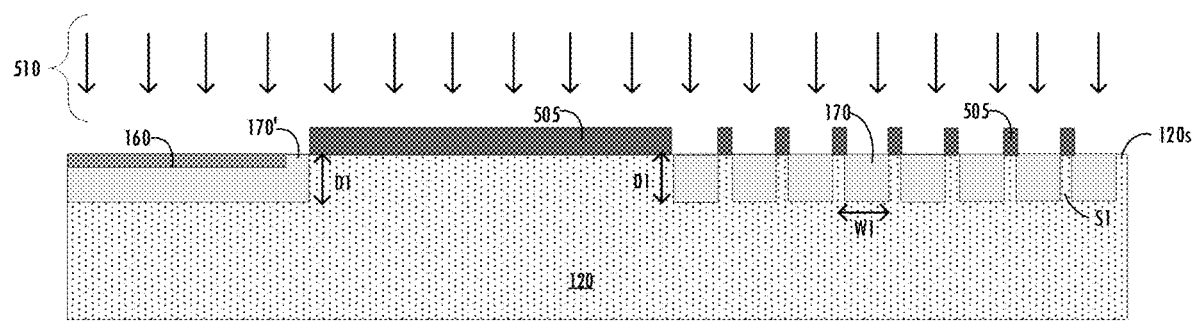

As shown in FIG. 6B, one or more relatively lower-energy first implantation processes 510 is performed using the first mask pattern 505 as an implantation mask to implant dopants of the second conductivity type (e.g. p-type) into the surface 120s of the drift region 120 exposed by the mask pattern 505 to define moderately-doped first portions 170 of the guard rings 36 in the edge termination region 16 with lateral spacings S1 (e.g., in the X and/or Y dimensions), and in some embodiments, well regions 170' in the active region 14, with relatively shallow depths D1. The lower-energy implantation 510 using the relatively thin first mask pattern 505 may allow for more precise control over the respective widths W1 of the first portions 170 of the guard rings 36, and thus may be used to define the respective gaps or narrow lateral spacings S1 between the first portions 170 of the guard rings 36.

Figure 6C:
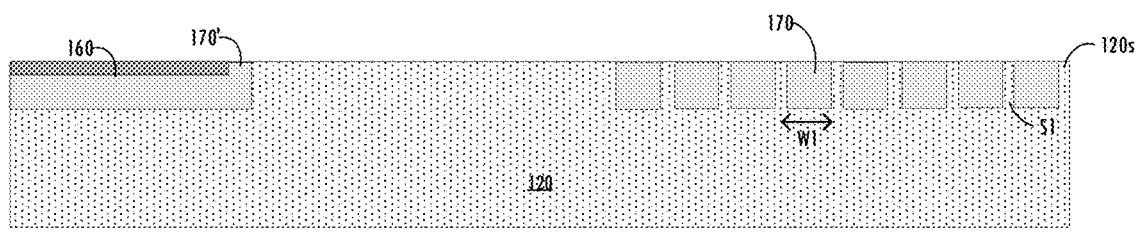
Figure 6D:
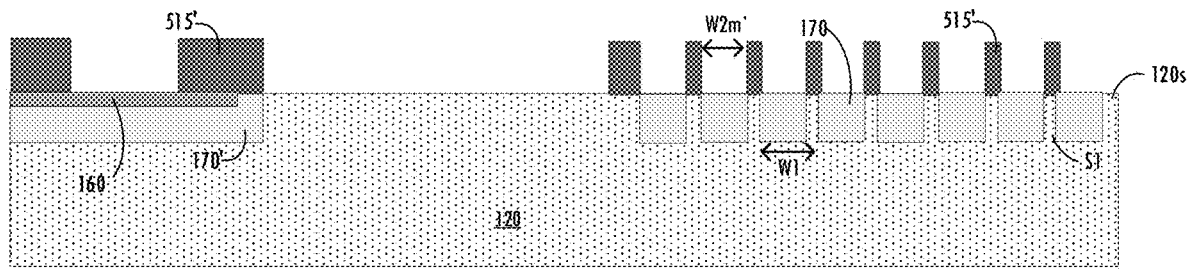

As shown in FIG. 6C, the first mask pattern 505 is removed, and a relatively thick second mask pattern 515' is formed on a surface 120s of the drift region 120 in FIG. 6D. The thickness of the second mask pattern 515' is greater than the thickness of the first mask pattern 505, and includes openings therein that expose portions of the surface 120s in the active region 14, the perimeter region 15, and the edge termination region 16. The openings in the second mask pattern 515' have respective widths W2m' that expose portions of the surface 120s in the edge termination region 16. The widths W2m' of the openings in the second mask pattern 515 may be wider than, equal to, or narrower than the widths W1m of the openings in the first mask pattern 505 in the edge termination region 16.

Figure 6E:
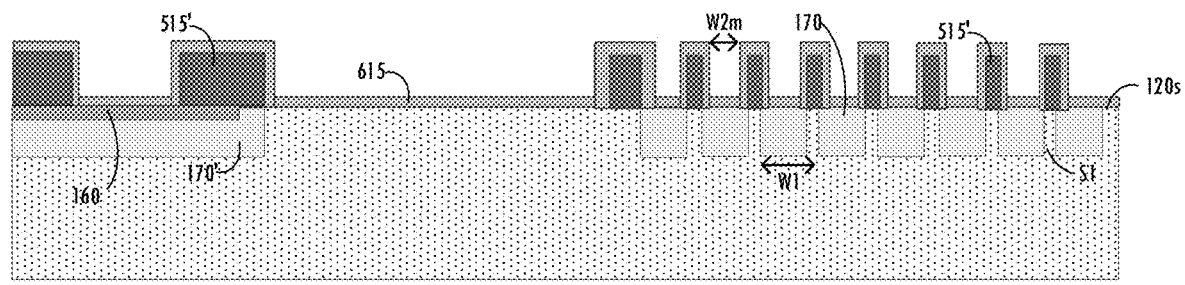

As shown in FIG. 6E, a conformal mask layer 615 is formed extending along the top surfaces and sidewalls of the second mask pattern 515', and on exposed portions of the surface 120s of the drift region 120. The conformal mask layer 615 may be a relatively thin dielectric layer (e.g., a nitride (such as SiN) or oxide layer), for example, having a thickness of about 0.1 μm to about 0.5 μm, e.g., about 0.25 μm to about 0.4 μm. The thickness of the conformal mask layer 615 may be selected such that deposition of the conformal mask layer 615 on the sidewalls of the second mask pattern 515' define openings having widths W2m that are narrower than the widths W2m' of the second mask pattern 515'.

Figure 6F:
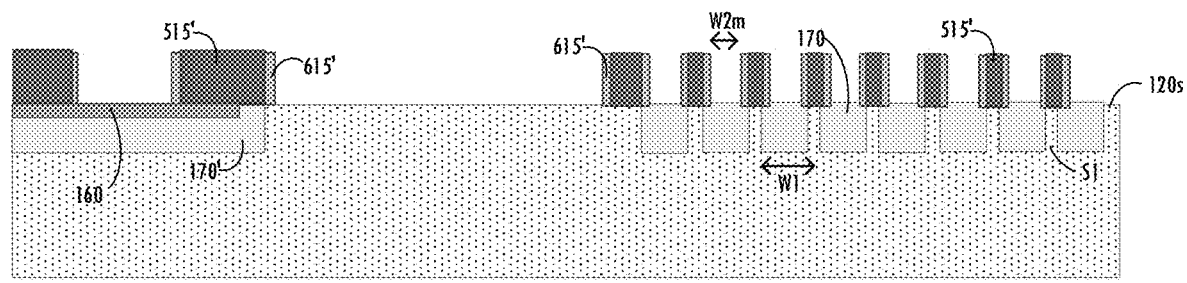

As shown in FIG. 6F, an etchback process (e.g., an anisotropic etch) is performed to remove portions of the conformal spacer layer 615 on the top surfaces of the second mask pattern 515' and on the exposed portions of the surface 120s of the drift region 120 to define spacers 615' on the sidewalls of the second mask patterns 515'. The spacers 615' overlap or cover edge portions or boundaries of the implanted regions 170 in one or more lateral (e.g., X and/or Y) dimensions. The second mask pattern 515' and the spacers 615' collectively define an implantation mask with openings therein that expose portions of the surface 120s in the active region 14, the perimeter region 15, and the edge termination region 16. The mask openings in the edge termination region 16 have respective widths W2m, while the mask openings in the active region 14 may be sized to define the shielding regions 140' so that both regions 14 and 16 can be implanted at the same time or otherwise using the same implantation mask 515', 615'.

Figure 6G:
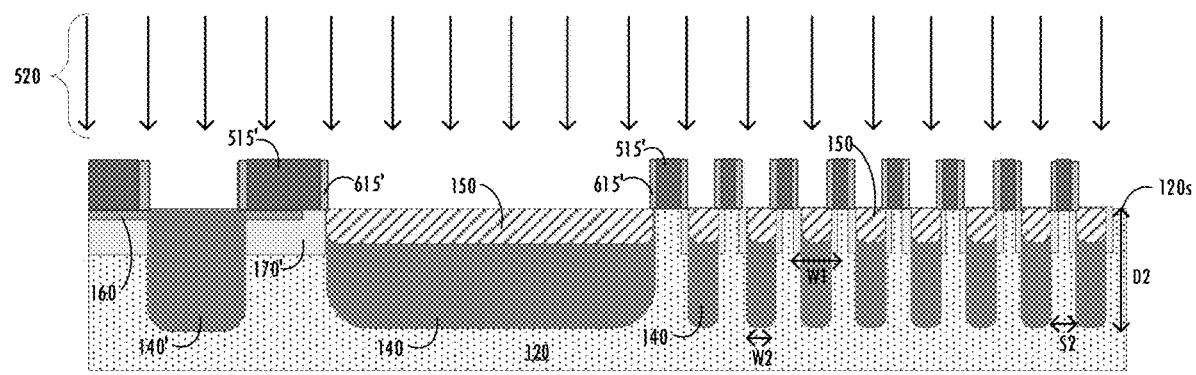

As shown in FIG. 6G, one or more relatively higher-energy second implantation processes 520 is performed using the second mask pattern 515' and the spacers 615' as an implantation mask to implant dopants of the second conductivity type (e.g. p-type) into the surface 120s of the drift region 120 exposed by the mask pattern 505 to define higher-doped second portions 140 of the guard rings 36 (in comparison to the first portions 170) in the edge termination region 16 with lateral spacings S2 (e.g., in the X and/or Y dimensions), and in some embodiments, shielding regions 140' in the active region 14, with relatively deep depths D2. The spacings S2 between adjacent portions 140 of the guard rings 36 may be non-uniform over the respective depths D2 in the edge termination region 16, and may define one or more step differences SD along sidewalls 36s of the guard rings 36.

By forming the spacers 615' from a relatively thin conformal layer 615 on sidewalls of the comparatively thicker second mask pattern 515', openings with narrower (e.g., sub-micron) widths W2m can be achieved (in comparison to the widths W2m' of the openings in second mask pattern 515'), with the spacers 615' overlapping edges or boundaries of the first portions 170 of adjacent guard rings 36. Thus, the higher-energy second implantation process(es) 520 may define the second portions 140 with relatively narrow (e.g., sub-micron) widths W2, thereby reducing or avoiding lateral straggle between adjacent guard rings 36. In some embodiments, the operations shown in FIGS. 6A-6H may achieve narrower mask opening widths W2m (and correspondingly narrower guard ring widths W2) than the operations shown in FIGS. 5A-5F.

The second implantation process(es) 520 may also include a lower-energy, higher concentration implantation process to form the implanted regions 150, providing third portions of the guard rings 36 having higher concentrations of the second conductivity type (in comparison to the second portions 140). The third portions 150 may be confined within the first portions 170 of the guard rings 36 in one or more dimensions, as noted above.

Figure 6H:
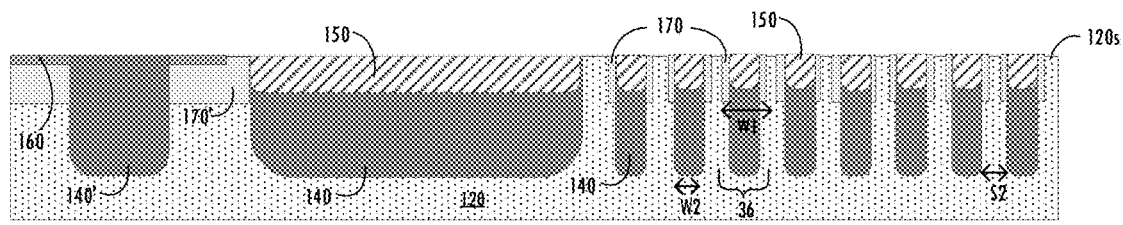

As shown in FIG. 6H, the second mask pattern 515' and the spacers 615' are removed from the surface 120s of the drift region 120 after performing the second, higher-energy implantation process(es) 520. Additional masking, etching, and/or deposition steps may be performed to define the gate trenches 180, gate insulating layers 182, and/or gates 184 in the active region 14, as shown in FIG. 1B.

Although illustrated in FIGS. 6A-6H as initially forming the implanted regions 170 using lower-energy implantation 510 and the first mask pattern 505 having wider openings W1m, and subsequently forming the implanted regions 140 and 150 using the higher-energy implantation 520 and the second mask pattern 515' and spacers 615' having narrower openings W2m, it will be understood that the portions 140, 150, 170 of the guard rings 36 need not be formed in the sequence shown. That is, the higher-energy deep implants 520 and lower-energy shallow implants 510 may be performed in any order, and are not limited to the order shown. For example, in some embodiments the implanted regions 140 and 150 may be initially formed using the higher-energy implantation 520 with the second mask pattern 515' and/or spacers 615' defining the narrower openings W2m, and the implanted regions 170 may be subsequently formed using the lower-energy implantation 510 with the first mask pattern 505 having wider openings W1m, as described below with reference to FIGS. 7A-7H.

FIGS. 7A-7H are schematic cross sectional views illustrating example operations in methods of fabricating a power semiconductor device according to some embodiments of the present disclosure. In particular, embodiments of the present disclosure as shown in FIGS. 7A-7H illustrate that the implantation order can be reversed in comparison to FIGS. 6A-6H. Description of aspects of FIGS. 7A-7H that are similar to structures and/or operations discussed above with reference to FIGS. 6A-6H may be abridged or omitted.

Figure 7A:
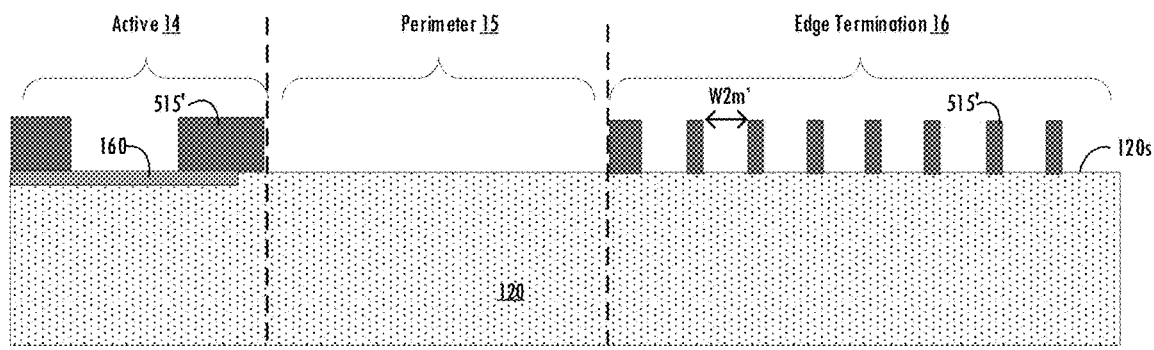
FIGS. 7A, 7B, 7 C, 7D, 7E, 7F, 7G, and 7H are schematic cross sectional views illustrating example operations in methods of fabricating a power semiconductor device according to some embodiments of the present disclosure.

As shown in FIG. 7A, the second mask pattern 515' is formed on the surface 120s of the drift region 120 including the active region 14, edge termination region 16, and perimeter region 15 therebetween. The second mask pattern 515' may be relatively thick, and includes openings therein that expose portions of the surface 120s in the active region 14, the perimeter region 15, and the edge termination region 16. The openings in the second mask pattern 515' have respective widths W2m' that expose portions of the surface 120s in the edge termination region 16.

Figure 7B:
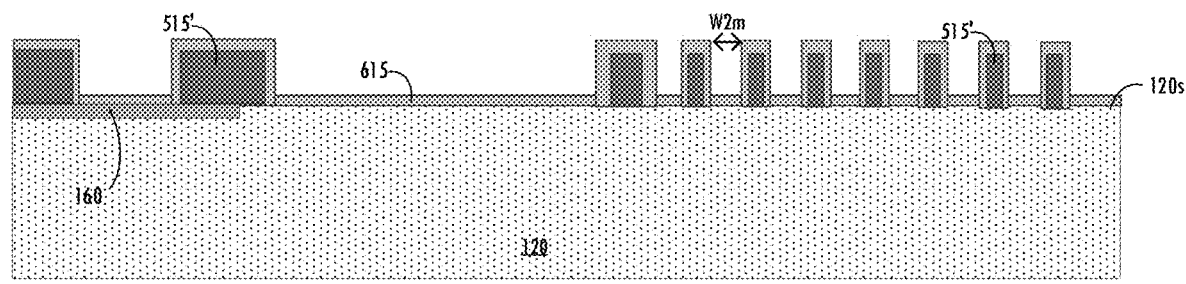

As shown in FIG. 7B, a conformal mask layer 615 is formed extending along the top surfaces and sidewalls of the second mask pattern 515', and on exposed portions of the surface 120s of the drift region 120. The conformal mask layer 615 may be relatively thin, with a thickness selected such that deposition of the conformal mask layer 615 on the sidewalls of the second mask pattern 515' define openings having widths W2m that are narrower than the widths W2m' of the second mask pattern 515'.

Figure 7C:
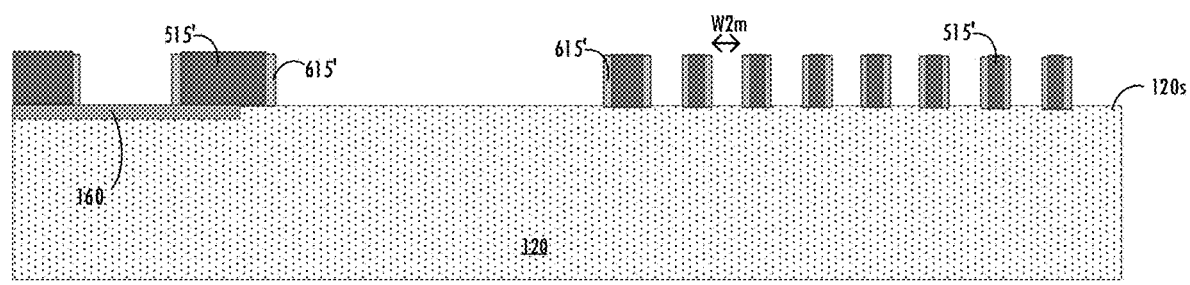

As shown in FIG. 7C, an etchback process is performed to remove portions of the conformal spacer layer 615 on the top surfaces of the second mask pattern 515' and on the exposed portions of the surface 120s of the drift region 120 to define spacers 615' on the sidewalls of the second mask patterns 515', where the spacers 615' overlap or cover edge portions or boundaries of the implanted regions 170 in one or more lateral dimensions. The second mask pattern 515' and the spacers 615' collectively define an implantation mask with openings therein that expose portions of the surface 120s in the active region 14, the perimeter region 15, and the edge termination region 16. The mask openings in the edge termination region 16 have respective widths W2m, while the mask openings in the active region 14 may be sized to define the shielding regions 140' so that both regions 14 and 16 can be implanted at the same time or otherwise using the same implantation mask 515', 615'.

Figure 7D:
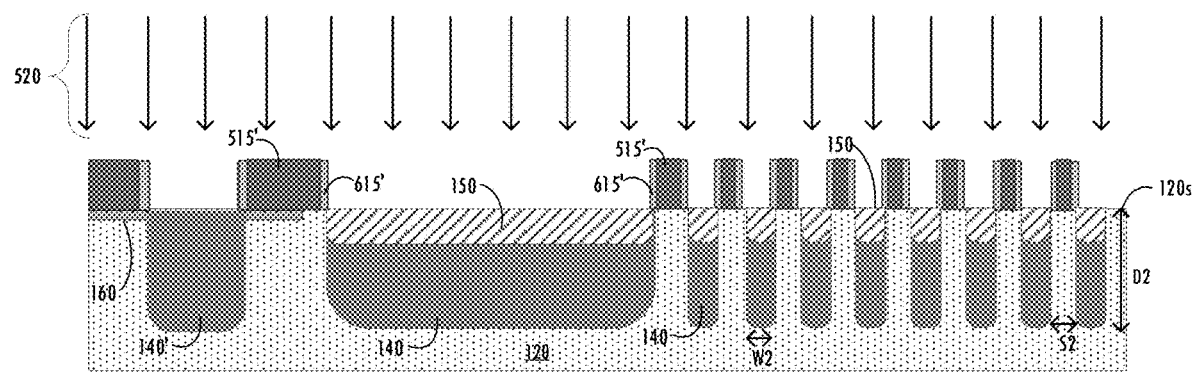

As shown in FIG. 7D, one or more relatively higher-energy second implantation processes 520 is performed using the second mask pattern 515' and the spacers 615' as an implantation mask to implant dopants of the second conductivity type (e.g. p-type) into the surface 120s of the drift region 120 exposed by the mask pattern 505 to define higher-doped second portions 140 of the guard rings 36 in the edge termination region 16 with lateral spacings S2, and in some embodiments, shielding regions 140' in the active region 14, with relatively deep depths D2. In some embodiments, the spacings S2 between adjacent portions 140 of the guard rings 36 may be non-uniform over the respective depths D2 in the edge termination region 16, and/or may define one or more step differences SD along sidewalls 36s of the guard rings 36 (e.g., as shown in FIGS. 3A-3B and 4A-4B).

The relatively thin spacers 615' on sidewalls of the comparatively thicker second mask pattern 515' provide openings with narrower (e.g., sub-micron) widths W2m (in comparison to the widths W2m' of the openings in second mask pattern 515'). The higher-energy second implantation process(es) 520 may thus define the second portions 140 with relatively narrow (e.g., sub-micron) widths W2, thereby reducing or avoiding lateral straggle between adjacent guard rings 36.

The second implantation process(es) 520 may also include a lower-energy, higher concentration implantation process to form the implanted regions 150, providing third portions of the guard rings 36 having higher concentrations of the second conductivity type (in comparison to the second portions 140). The third portions 150 may be confined within the first portions 170 of the guard rings 36 in one or more dimensions, as noted above.

Figure 7E:
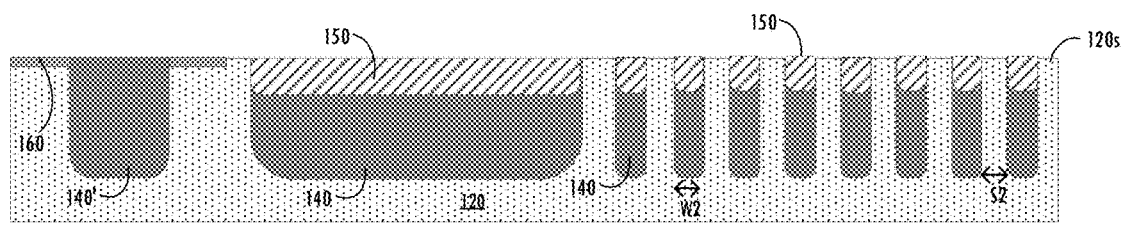
Figure 7F:
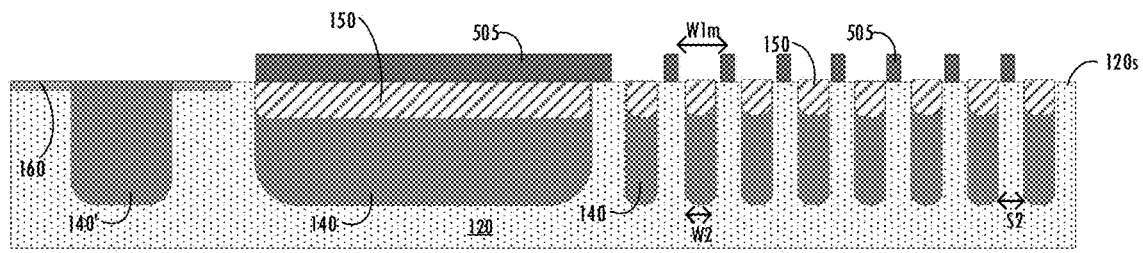

As shown in FIG. 7E, the second mask pattern 515' and the spacers 615' are removed from the surface 120s of the drift region 120 after performing the second, higher-energy implantation process(es) 520. In FIG. 7F, the first mask pattern 505 is formed on the surface 120s of the drift region 120.

The first mask pattern 505 may be relatively thin (in comparison to the second mask pattern 515'), and includes openings therein that expose portions of the surface 120s in the active region 14 and the edge termination region 16. The first mask pattern 505 may cover the surface of the drift region 120s (and the implanted regions 140, 150) in the perimeter region 15. The mask openings in the edge termination region 16 have respective widths W1m. The widths W1m of the mask openings are wider than the widths W2 of the implanted regions 140 and/or 150, such that portions of the surface 120s on opposite sides of the implanted regions 140 and 150 are exposed by the mask openings in first mask pattern 505 in the edge termination region 16. The mask openings in the active region 14 may also be sized to define the well regions 170' so that both regions 14 and 16 can be implanted at the same time or otherwise using the same implantation mask 505.

Figure 7G:
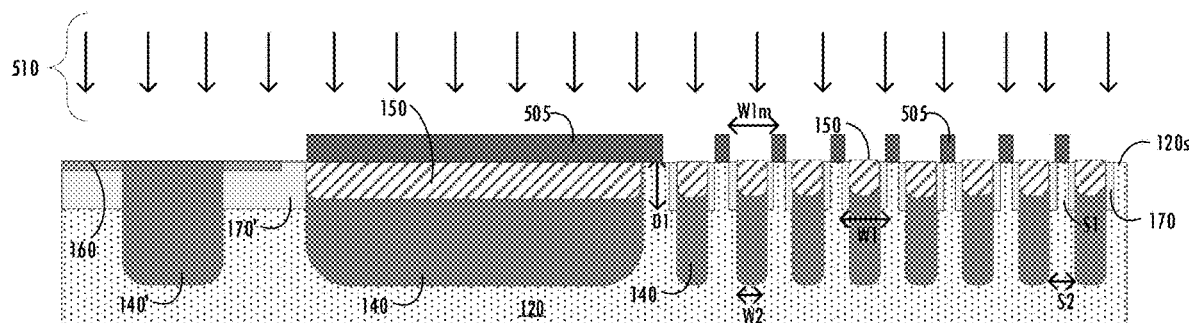

As shown in FIG. 7G, one or more relatively lower-energy first implantation processes 510 is performed using the first mask pattern 505 as an implantation mask to implant dopants of the second conductivity type (e.g. p-type) into the surface 120s of the drift region 120 exposed by the mask pattern 505 to define moderately-doped first portions 170 of the guard rings 36 in the edge termination region 16 with lateral spacings S1, and in some embodiments, well regions 170' in the active region 14, with relatively shallow depths D1. The first portions 170 of the guard rings 36 may laterally extend outside the second portions 140 and/or the third portions 150, and may be formed to a depth D1 in the drift layer 120 that is less than the depth D2 to which the second portions 140 of the guard rings 36 extend.

The lower-energy implantation 510 using the relatively thin first mask pattern 505 may allow for more precise control over the respective widths W1 of the first portions 170 of the guard rings 36, without substantially affecting the higher-concentration second portions 140 and/or third portions 150 of the guard rings 36 achieved by the previous implantation operations 520. Thus, the respective gaps or narrow lateral spacings S1 between the first portions 170 of the guard rings 36 may be defined to be substantially uniform using the lower-energy implantation 510 and the relatively thin first mask pattern 505, so as to reduce or avoid lateral straggle between adjacent guard rings 36.

Figure 7H:
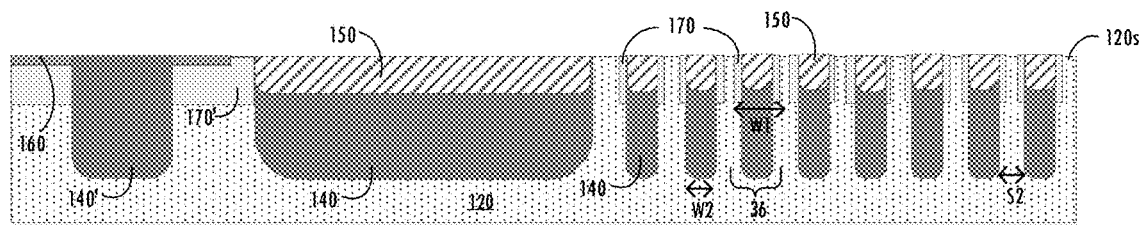

As shown in FIG. 7H, the first mask pattern 505 is removed. Additional masking, etching, and/or deposition steps may be performed to define the gate trenches 180, gate insulating layers 182, and/or gates 184 in the active region 14, as shown in FIG. 1B.

Although illustrated in FIGS. 7A-7H with reference to particular operations and sequences of operations, it will be understood that the illustrated operations may be performed in other sequences (e.g., as shown in FIGS. 6A-6H) and/or with additional or omitted operations (e.g., as shown in FIGS. 5A-5F where the second mask pattern 515 includes the narrower openings W2m and the operations to fabricate the spacers 615' are omitted). That is, the portions 140, 150, 170 of the guard rings 36 need not be formed in the sequence shown, and the higher-energy deep implantation 520 and lower-energy shallow implantation 510 may be performed in any order with additional or fewer operations than those specifically illustrated.

FIGS. 8A-8F are schematic cross sectional views illustrating example operations in methods of fabricating a power semiconductor device according to some embodiments of the present disclosure. In particular, embodiments of the present disclosure as shown in FIGS. 8A-8F, illustrate that the implantation operations can be performed in a self-aligned process and using a spacer fabrication process to achieve openings having the desired sub-micron widths. Description of aspects of FIGS. 8A-8F that are similar to structures and/or operations discussed above with reference to FIGS. 5A-5F, 6A-6H and/or 7A-7H may be abridged or omitted.

Figure 8A:
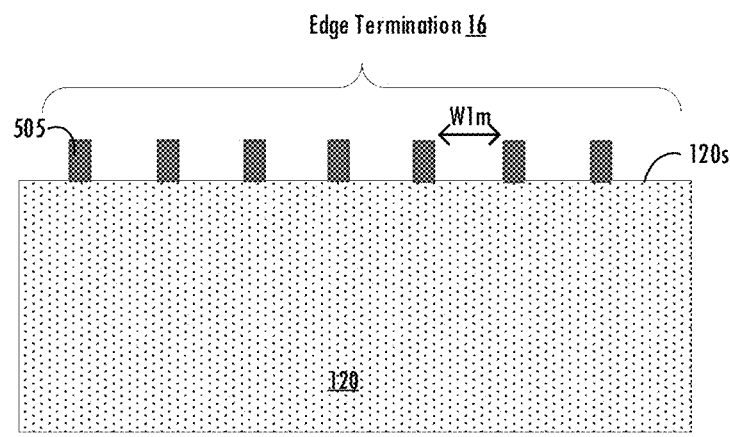
FIGS. 8A, 8B, 8C, 8 D, 8E, and 8F are schematic cross sectional views illustrating example operations in methods of fabricating a power semiconductor device according to some embodiments of the present disclosure.
Figure 9:
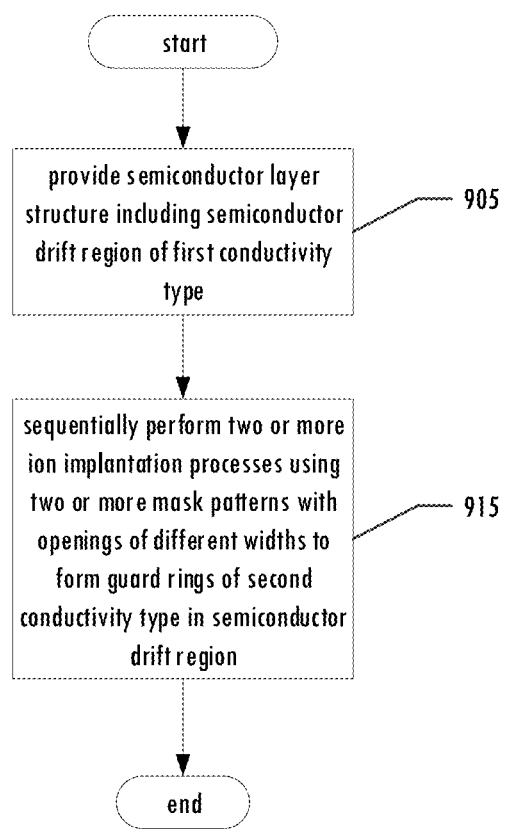
FIG. 9 is a flowchart illustrating operations for fabricating power semiconductor devices in accordance with embodiments of the present disclosure.

As shown in FIG. 8A, the first mask pattern 505 is formed on the surface 120s of the drift region 120 with openings therein that expose portions of the surface 120s in the edge termination region 16. The first mask pattern 505 may be a relatively thin layer (e.g., a nitride or oxide layer, such as SiN), for example, having a thickness of about 1 μm to about 2 μm. The mask openings in the edge termination region 16 have respective widths W1m. In some embodiments, the first mask pattern 505 may also be formed on the active region 14 (not shown) with mask openings sized to define the well regions 170'.

Figure 8B:
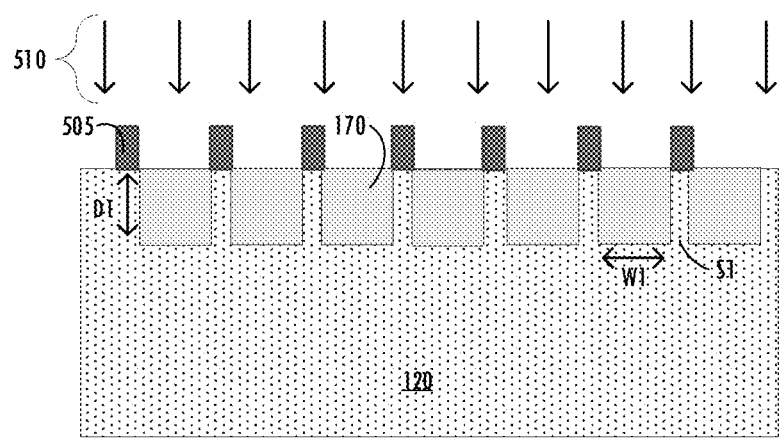

As shown in FIG. 8B, one or more relatively lower-energy first implantation processes 510 is performed using the first mask pattern 505 as an implantation mask to implant dopants of the second conductivity type (e.g. p-type) into the surface 120s of the drift region 120 exposed by the mask pattern 505 to define moderately-doped first portions 170 of the guard rings 36 in the edge termination region 16 with lateral spacings S1 (and in some embodiments, well regions 170' in the active region 14) and with relatively shallow depths D1. The lower-energy implantation 510 using the relatively thin first mask pattern 505 may allow for more precise control over the respective widths W1 of the implanted regions 170 that provide the first portions of the guard rings 36, and thus may be used to define the respective gaps with the desired lateral spacings S1 (which may be substantially uniform over the depths D1) between the first portions 170 of the guard rings 36.

Figure 8C:
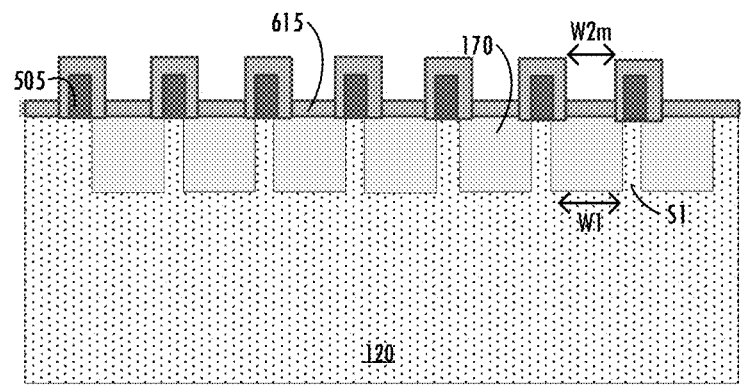

As shown in FIG. 8C, a conformal mask layer 615 is formed extending along the top surfaces and sidewalls of the first mask pattern 505, and on exposed portions of the surface 120s of the drift region 120. The conformal mask layer 615 may be a relatively thin dielectric layer, as discussed above with reference to FIG. 6E. The thickness of the conformal mask layer 615 may be selected such that deposition of the conformal mask layer 615 on the sidewalls of the first mask pattern 505 define openings having widths W2m that are narrower than the widths W1m of the first mask pattern 505.

Figure 8D:
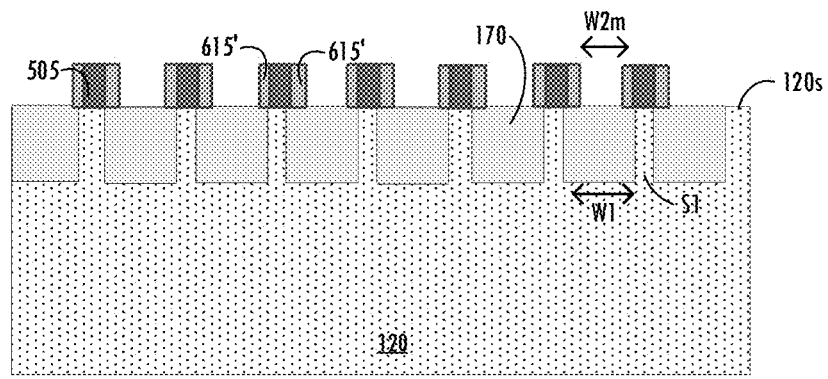

As shown in FIG. 8D, an etchback process (e.g., an anisotropic etch) is performed to remove portions of the conformal spacer layer 615 on the top surfaces of the first mask pattern 505 and on the exposed portions of the surface 120s of the drift region 120 to define spacers 615' on the sidewalls of the first mask patterns 505. The spacers 615' overlap or cover edge portions or boundaries of the implanted regions 170 in one or more lateral (e.g., X and/or Y) dimensions. The first mask pattern 505 and the spacers 615' collectively define an implantation mask with openings therein that expose portions of the surface 120s in the edge termination region 16. The mask openings in the edge termination region 16 have respective widths W2m.

Figure 8E:
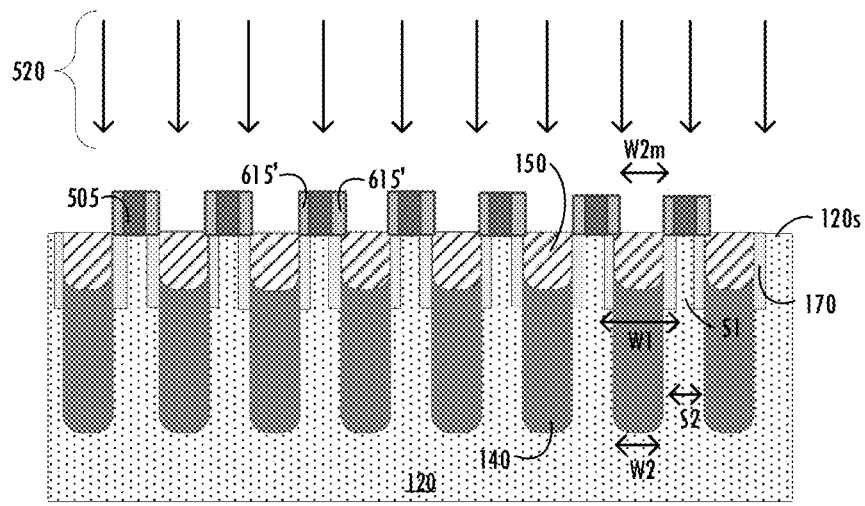

As shown in FIG. 8E, one or more relatively higher-energy second implantation processes 520 is performed using the first mask pattern 505 and the spacers 615' as an implantation mask to implant dopants of the second conductivity type (e.g. p-type) into the surface 120s of the drift region 120 exposed by the mask pattern 505 to define higher-doped second portions 140 of the guard rings 36 in the edge termination region 16 with lateral spacings S2 and relatively deep depths D2. By forming the spacers 615' from a relatively thin conformal layer 615 on sidewalls of the first mask pattern 505, openings with narrower (e.g., sub-micron) widths W2m can be achieved. In some embodiments, the second implantation processes 520 may include a deep channeling implant process at lower implantation energies (e.g., about 50 keV to about 500 keV) than in the embodiments of FIGS. 5A-5F, 6A-6H, and/or 7A-7H, which may allow for the second portions 140 of the guard rings 36 to be implanted to the depths D2 while maintaining the desired lateral spacings S1, S2 and while still using the thinner first mask pattern 505.

Thus, the second implantation process(es) 520 may define the second portions 140 with relatively narrow (e.g., sub-micron) widths W2, thereby reducing or avoiding lateral straggle between adjacent guard rings 36. The spacings S2 between adjacent portions 140 of the guard rings 36 may be non-uniform over the respective depths D2 in the edge termination region 16 in some embodiments. Also, one or more step differences SD may be defined along sidewalls 36s of the guard rings 36, as shown in FIGS. 2A to 4B. In particular, the step differences SD may be formed due to the differences in widths W1 and W2 of the first portions 170 and the second portions 140 of the guard rings 36.

Figure 8F:
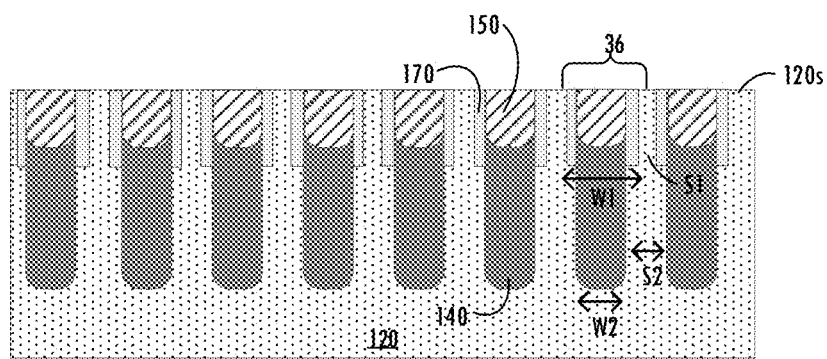

The second implantation process(es) 520 may also include a lower-energy, higher concentration implantation process to form the implanted regions 150, providing third portions of the guard rings 36 having higher concentrations of the second conductivity type than the second portions 140. The third portions 150 may be confined within the first portions 170 of the guard rings 36 in one or more dimensions, as noted above. As shown in FIG. 8F, the first mask pattern 505 and the spacers 615' are removed from the surface 120s of the drift region 120 after performing the second implantation process(es) 520.

Although illustrated in FIGS. 8A-8F as initially forming the implanted regions 170 using lower-energy implantation 510 and the first mask pattern 505 having wider openings W1m, and subsequently forming the implanted regions 140 and 150 using the higher-energy implantation 520 and the spacers 615' having narrower openings W2m, it will be understood that the portions 140, 150, 170 of the guard rings 36 need not be formed in the sequence shown. More generally, embodiments of the present invention may include any combination of the above and/or other operations to provide sub-micron shield patterns 140 using multiple mask and/or implantation processes while maintaining consistent guarding ring spacings S1, S2 through the edge termination region 16.

Additional masking, etching, and/or deposition steps may be performed to define the gate trenches 180 extending into the surface 120s of the drift region 120 in the active region 14, and to form gate insulating layers 182 and gate electrodes 184 in the trenches 180. For example, as shown in FIG. 1B, a gate insulating layer 182 such as an oxide layer is formed on the bottom surface and sidewalls of each gate trench 180. A gate electrode 184 is formed on each gate insulating layer 182. Contacts may be formed on the top and bottom surfaces of the semiconductor layer structure 106.

For example, a drain contact may be formed on the lower surface of the substrate 110 opposite the drift region 120. Source contacts may be formed at the upper portion of the semiconductor layer structure on the heavily-doped source region 160. The source contacts may provide electrical connection to the shielding patterns 140' in some embodiments. The source contacts may be ohmic metal in some embodiments, and may provide a common source that is configured to electrically connect the shielding patterns 140' to an electrical ground. While the fabrication steps are set forth in example orders or sequences in the discussion above, it will be appreciated that the fabrication steps may be performed in a different order. For example, the order of the various etching and ion implantation steps may be changed from what is described above.

While the present disclosure is described herein primarily with respect to power MOSFET implementations, it will be appreciated that the techniques described herein apply equally well to other power semiconductor devices that may include junction or edge termination regions. That is, embodiments of the present disclosure are not limited MOSFETs, and the techniques disclosed herein may be used in other power semiconductor devices, such as IGBTs, Schottky diodes, or any other appropriate device.

It will be appreciated that features of the different embodiments disclosed herein may be combined in any way to provide many additional embodiments. For example, features of any MOSFET embodiment described herein may be incorporated into IGBT embodiments fabricated on SiC, or other semiconductor materials such as S1. Thus, it will be appreciated that various features of the inventive concepts are described herein with respect to specific examples, but that these features may be added to other embodiments and/or used in place of example features of other embodiments to provide many additional embodiments. The present disclosure should therefore be understood to encompass these different combinations.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present disclosure covers both n-channel and p-channel devices for each different device structure (e.g., MOSFET, IGBT, etc.).

The present disclosure has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above. It will also be appreciated that the different features of the different embodiments described herein may be combined to provide additional embodiments.

Embodiments of the present disclosure have been described above with reference to the accompanying drawings, in which embodiments of the invention are shown. It will be appreciated, however, that this invention may be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present disclosure. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to flow charts. It will be appreciated that the steps shown in the flow charts need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A power semiconductor device, comprising:
   a semiconductor layer structure comprising a semiconductor drift region of a first conductivity type and an edge termination region comprising a plurality of guard rings of a second conductivity type,
   wherein one or more of the guard rings extend in the semiconductor drift region to a depth of greater than about 1 micrometers (μm) relative to a surface of the semiconductor layer structure, and two or more of the guard rings are laterally separated from one another by a spacing of less than about 3 μm.

2. The power semiconductor device of claim 1, wherein the one or more of the guard rings respectively comprise a first portion adjacent the surface and a second portion spaced from the surface, wherein the first portion is wider than the second portion.

3. The power semiconductor device of claim 2, wherein the second portion comprises a higher concentration of dopants of the second conductivity type than the first portion.

4. The power semiconductor device of claim 2, wherein the first portion extends into the surface to a first depth, and wherein the second portion extends through the first portion to a second depth that is greater than the first depth.

5. The power semiconductor device of claim 2, wherein the one or more of the guard rings respectively comprise a third portion comprising a higher concentration of dopants of the second conductivity type than the second portion.

6. The power semiconductor device of claim 5, wherein the third portion is narrower than the first portion.

7. The power semiconductor device of claim 5, wherein the third portion is confined within the first portion in two or more dimensions.

8. The power semiconductor device of claim 2, wherein the one or more of the guard rings respectively comprise a sidewall comprising a step difference between the first and second portions.

9. The power semiconductor device of claim 4, wherein the semiconductor layer structure further comprises an active region comprising a plurality of well regions of the second conductivity type in the semiconductor drift region, wherein the well regions extend to the first depth.

10. The power semiconductor device of claim 9, wherein the active region further comprises a plurality of shielding patterns comprising a higher concentration of dopants of the second conductivity type than the well regions, wherein the shielding patterns extend to the second depth.

11. The power semiconductor device of claim 2, wherein the spacing is substantially uniform between the first portions.

12. The power semiconductor device of claim 1, wherein the depth is about 1 μm to about 3 μm, and wherein the spacing is about 0.5 lam to about 3 μm.

13. The power semiconductor device of claim 1, wherein the one or more of the guard rings respectively comprise a first width adjacent the surface and a second width spaced from the surface, and wherein a ratio of the first width to the second width is about 0.95 to about 2.

14. A power semiconductor device, comprising:
   a semiconductor layer structure comprising a semiconductor drift region of a first conductivity type and an edge termination region comprising a plurality of guard rings of a second conductivity type in the semiconductor drift region,
   wherein one or more of the guard rings respectively comprise a first portion adjacent a surface of the semiconductor layer structure and a second portion spaced from the surface of the semiconductor layer structure, wherein the second portion comprises a higher concentration of dopants of the second conductivity type than the first portion.

15. The power semiconductor device of claim 14, wherein the first portion is wider than the second portion.

16. The power semiconductor device of claim 15, wherein the first portion extends into the surface to a first depth, and wherein the second portion extends through the first portion and to a second depth that is greater than the first depth.

17. The power semiconductor device of claim 15, wherein the one or more of the guard rings respectively comprise a third portion comprising a higher concentration of dopants of the second conductivity type than the second portion, wherein the third portion is narrower than the first portion.

18. The power semiconductor device of claim 14, wherein two or more of the guard rings are laterally separated from one another by a spacing, wherein the spacing is substantially uniform between the first portions.

19. A power semiconductor device, comprising:
   a semiconductor layer structure comprising a semiconductor drift region of a first conductivity type and an edge termination region comprising a plurality of guard rings of a second conductivity type in the semiconductor drift region,
   wherein one or more of the guard rings respectively comprise a first portion adjacent a surface of the semiconductor layer structure, a second portion spaced from the surface of the semiconductor layer structure, and a sidewall, wherein the sidewall of a respective guard ring comprises a step difference between the first and second portions.

20. The power semiconductor device of claim 19, wherein the second portion comprises a higher concentration of dopants of the second conductivity type than the first portion, and wherein the step difference is defined at an interface between the first and second portions.

21. The power semiconductor device of claim 20, wherein the first portion is wider than the second portion.

22. The power semiconductor device of claim 20, wherein the first portion extends into the surface to a first depth, and wherein the second portion extends through the first portion to a second depth that is greater than the first depth.

23. The power semiconductor device of claim 22, wherein the semiconductor layer structure further comprises an active region comprising a plurality of well regions of the second conductivity type in the semiconductor drift region, wherein the well regions extend to the first depth.

24. The power semiconductor device of claim 23, wherein the active region further comprises a plurality of shielding patterns comprising a higher concentration of dopants of the second conductivity type than the well regions, wherein the shielding patterns extend to the second depth.

25. A power semiconductor device, comprising:
   a semiconductor layer structure comprising a semiconductor drift region of a first conductivity type and an edge termination region comprising a plurality of guard rings of a second conductivity type in the semiconductor drift region, wherein one or more of the guard rings respectively comprise a first width adjacent a surface of the semiconductor layer structure and a second width spaced from the surface of the semiconductor layer structure, and wherein a ratio of the first width to the second width is about 0.95 to about 2.

26. The power semiconductor device of claim 25, wherein the one or more of the guard rings respectively comprise a first portion comprising the first width between outermost boundaries thereof and a second portion comprising the second width between outermost boundaries thereof, wherein the first portion is wider than the second portion.

27. The power semiconductor device of claim 26, wherein the second portion comprises a higher concentration of dopants of the second conductivity type than the first portion.

28. The power semiconductor device of claim 26, wherein the first portion extends into the surface to a first depth, and wherein the second portion extends through the first portion to a second depth that is greater than the first depth.

29. The power semiconductor device of claim 26, wherein the one or more of the guard rings respectively comprise a third portion comprising a higher concentration of dopants of the second conductivity type than the second portion, wherein the third portion is narrower than the first portion.

30. The power semiconductor device of claim 26, wherein the one or more of the guard rings respectively comprise a sidewall comprising a step difference between the first and second portions.

31. The power semiconductor device of claim 25, wherein the ratio is about 0.95 to about 1.05.

32. The power semiconductor device of claim 25, wherein the ratio is about 0.99 to about 1.01.

* * * * *

UNITED STATES PATENT AND TRADEMARK OFFICE
CERTIFICATE OF CORRECTION

PATENT NO. : 12,009,389 B2
APPLICATION NO. : 17/538026
DATED : June 11, 2024
INVENTOR(S) : Kim et al.

It is certified that error appears in the above-identified patent and that said Letters Patent is hereby corrected as shown below:

In the Specification

Column 14, Line 8: Please correct "Sift" to read --$SiO_2$--

Column 21, Line 21: Please correct "Sift" to read --$SiO_2$--

Column 23, Line 30: Please correct "S1" to read --Si--

In the Claims

Column 25, Line 62, Claim 12: Please correct "0.5 lam" to read --0.5 µm--

Signed and Sealed this
Twenty-seventh Day of August, 2024

Katherine Kelly Vidal
*Director of the United States Patent and Trademark Office*